(12) United States Patent
Girdhar et al.

(10) Patent No.: US 7,465,986 B2
(45) Date of Patent: Dec. 16, 2008

(54) POWER SEMICONDUCTOR DEVICE INCLUDING INSULATED SOURCE ELECTRODES INSIDE TRENCHES

(75) Inventors: Dev Alok Girdhar, Palm Bay, FL (US); Ling Ma, Torrance, CA (US); Steven T. Peake, Warrington (GB); David Paul Jones, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 219 days.

(21) Appl. No.: 11/211,268

(22) Filed: Aug. 25, 2005

(65) Prior Publication Data

US 2006/0060916 A1    Mar. 23, 2006

Related U.S. Application Data

(60) Provisional application No. 60/605,340, filed on Aug. 27, 2004.

(51) Int. Cl.
*H01L 29/94* (2006.01)
(52) U.S. Cl. .............. 257/330; 257/341; 257/499; 257/500; 257/E29.019; 257/E21.544
(58) Field of Classification Search ........... 257/499, 257/500, 341, 330
See application file for complete search history.

(56) References Cited

U.S. PATENT DOCUMENTS

| 5,282,018 | A | 1/1994 | Hiraki et al. | |
| 5,637,898 | A | 6/1997 | Baliga | 257/330 |
| 5,864,159 | A | 1/1999 | Takahashi | |
| 5,973,359 | A * | 10/1999 | Kobayashi et al. | 257/328 |
| 5,998,833 | A | 12/1999 | Baliga | 257/329 |
| 6,069,372 | A * | 5/2000 | Uenishi | 257/139 |
| 6,114,727 | A | 9/2000 | Ogura et al. | |
| 6,191,447 | B1 * | 2/2001 | Baliga | 257/330 |
| 6,251,730 | B1 * | 6/2001 | Luo | 438/270 |

(Continued)

FOREIGN PATENT DOCUMENTS

JP    8116056    5/1996

(Continued)

OTHER PUBLICATIONS

Yung C. Liang et al.: "Oxide-Bypassed VDMOS (OBVDMOS): An Alternative to Superjunction High Voltate MOS Power Devices", IEEE Electron Devices Letters, vol. 22, No. 8, Aug. 2001.

(Continued)

*Primary Examiner*—Wai-Sing Louie
*Assistant Examiner*—Marc Armand
(74) *Attorney, Agent, or Firm*—Ostrolenk, Faber, Gerb & Soffen, LLP

(57) ABSTRACT

A power semiconductor device includes a plurality of trenches formed within a semiconductor body, each trench including one or more electrodes formed therein. In particular, according to embodiments of the invention, the plurality of trenches of a semiconductor device may include one or more gate electrodes, may include one or more gate electrodes or one or more source electrodes, or may include a combination of both gate and source electrodes formed therein. The trenches and electrodes may have varying depths within the semiconductor body.

34 Claims, 25 Drawing Sheets

U.S. PATENT DOCUMENTS

| | | |
|---|---|---|
| 6,388,286 B1 | 5/2002 | Baliga |
| 6,525,373 B1 | 2/2003 | Kim |
| 6,541,820 B1 * | 4/2003 | Bol .......................... 257/341 |
| 6,649,975 B2 | 11/2003 | Baliga ...................... 257/330 |
| 6,686,244 B2 * | 2/2004 | Blanchard ................. 438/268 |
| 6,710,403 B2 * | 3/2004 | Sapp ......................... 257/330 |
| 6,803,627 B2 * | 10/2004 | Pfirsch ...................... 257/341 |
| 2001/0041407 A1 | 11/2001 | Brown ....................... 438/270 |
| 2001/0052617 A1 | 12/2001 | Kitada et al. .............. 257/330 |
| 2002/0185679 A1 * | 12/2002 | Baliga ...................... 257/329 |
| 2003/0203576 A1 | 10/2003 | Kitada et al. .............. 438/270 |
| 2005/0001268 A1 * | 1/2005 | Baliga ...................... 257/341 |

FOREIGN PATENT DOCUMENTS

| | | |
|---|---|---|
| JP | 10107286 | 4/1998 |
| JP | 2000299464 | 10/2000 |
| JP | 2004134666 | 4/2004 |
| JP | 2004235438 | 8/2004 |
| TW | 451236 | 8/2001 |
| TW | 490853 | 6/2002 |
| TW | 512438 | 12/2002 |
| TW | 521331 | 2/2003 |
| TW | 583747 | 4/2004 |

OTHER PUBLICATIONS

Yung C. Liang et al.: "Tunable Oxide-Bypassed VDMOS (OBVDMOS): Breaking the Silicon Limit for the Second Generation", IEEE International Symposium on Power Semiconductor Devices & IC: (ISPSD), pp. 201-204, IEEE, 2002.

Xin Yang et al.: "Tunable-Oxide-Bypassed Trench Gate MOSFET: Breaking the Ideal Superjunction MOSFET Performance Line at Equal Column Width," IEEE Electron Device Letters, vol. 24, No. 11, Nov. 2003.

Buried Source Structure by Infineon.

Search Report and Office Action issued by the Taiwanese Patent Office in corresponding Taiwanese Application No. 94129325 dated Jan. 2008.

* cited by examiner

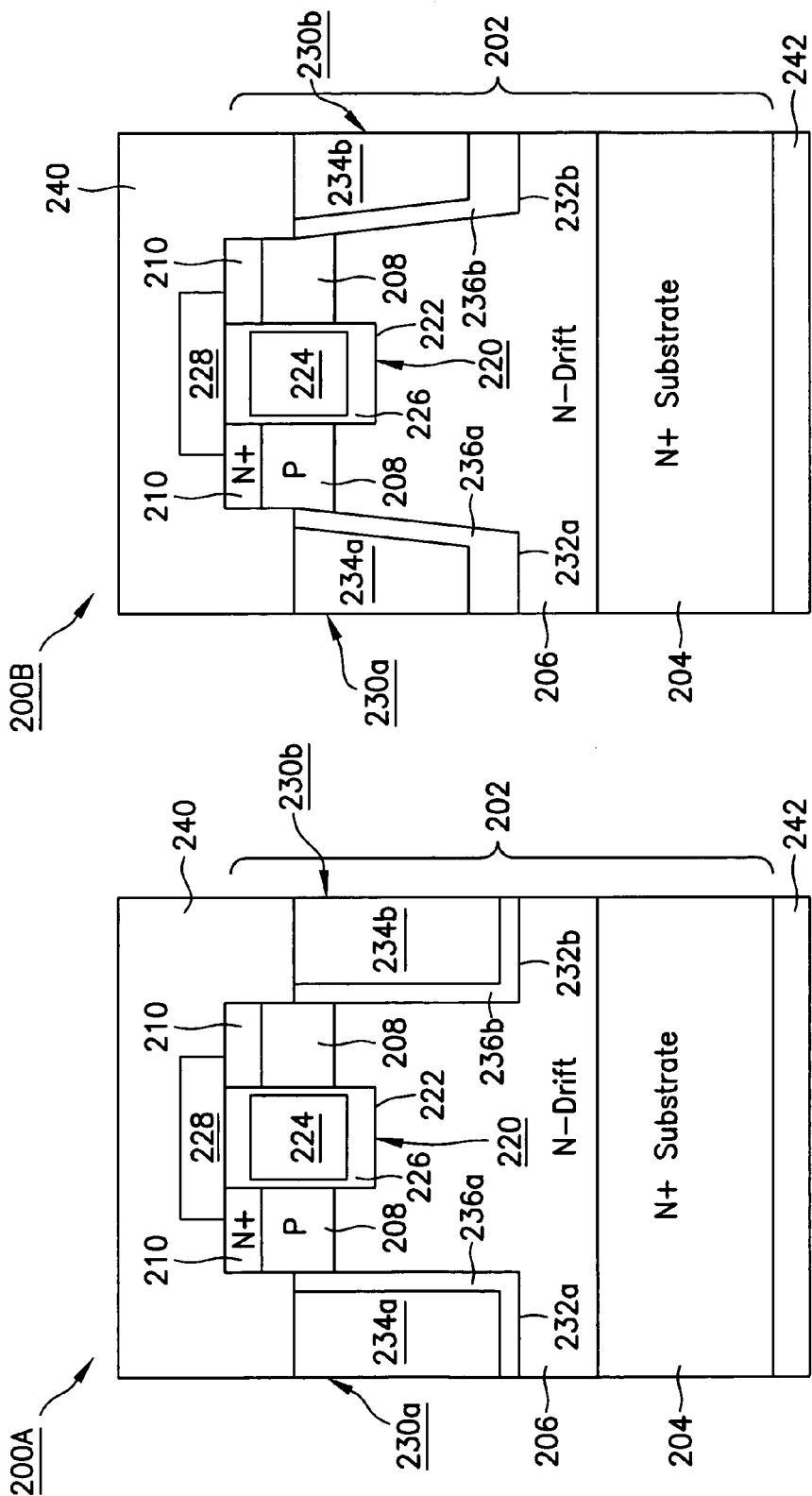

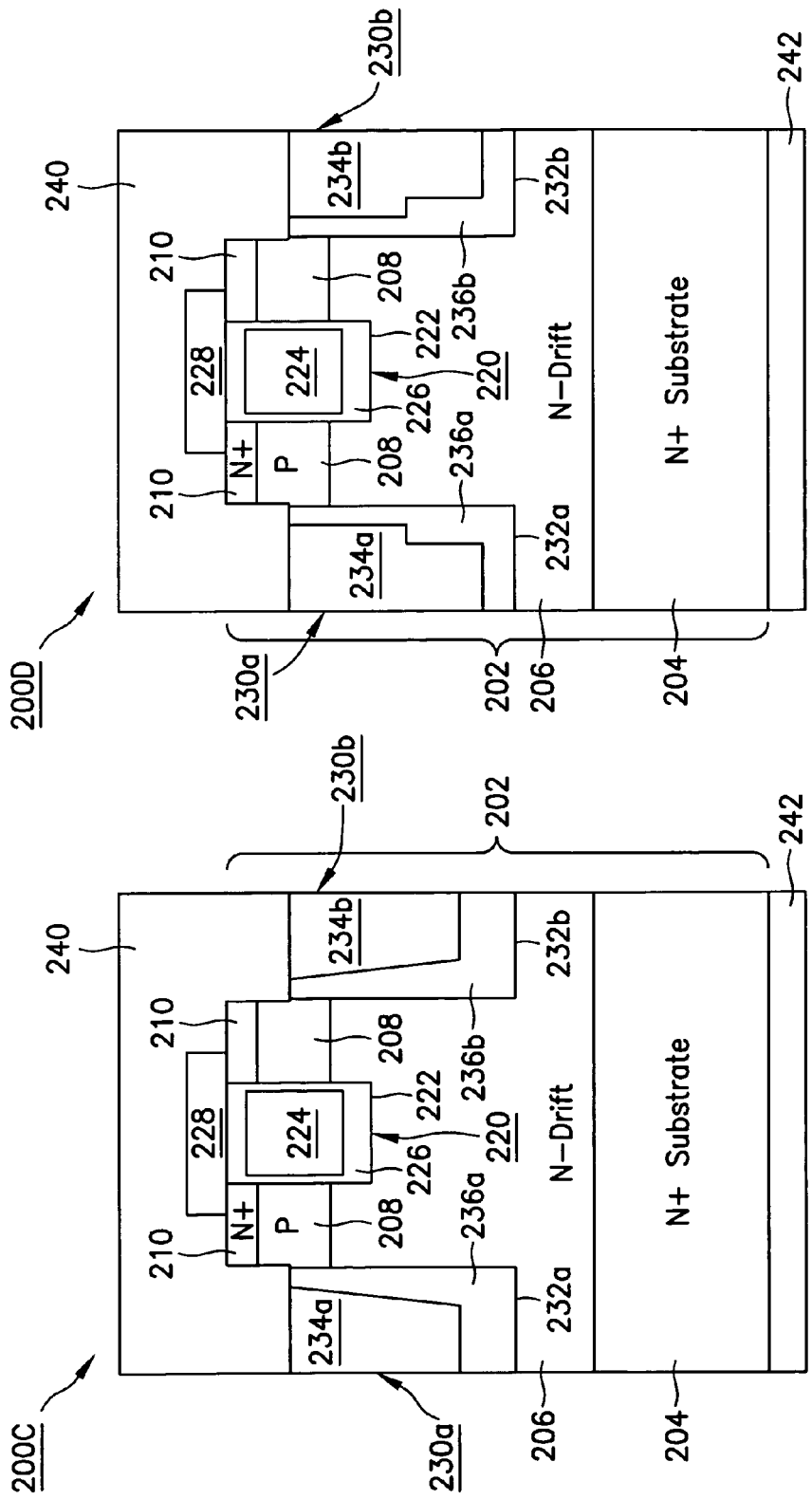

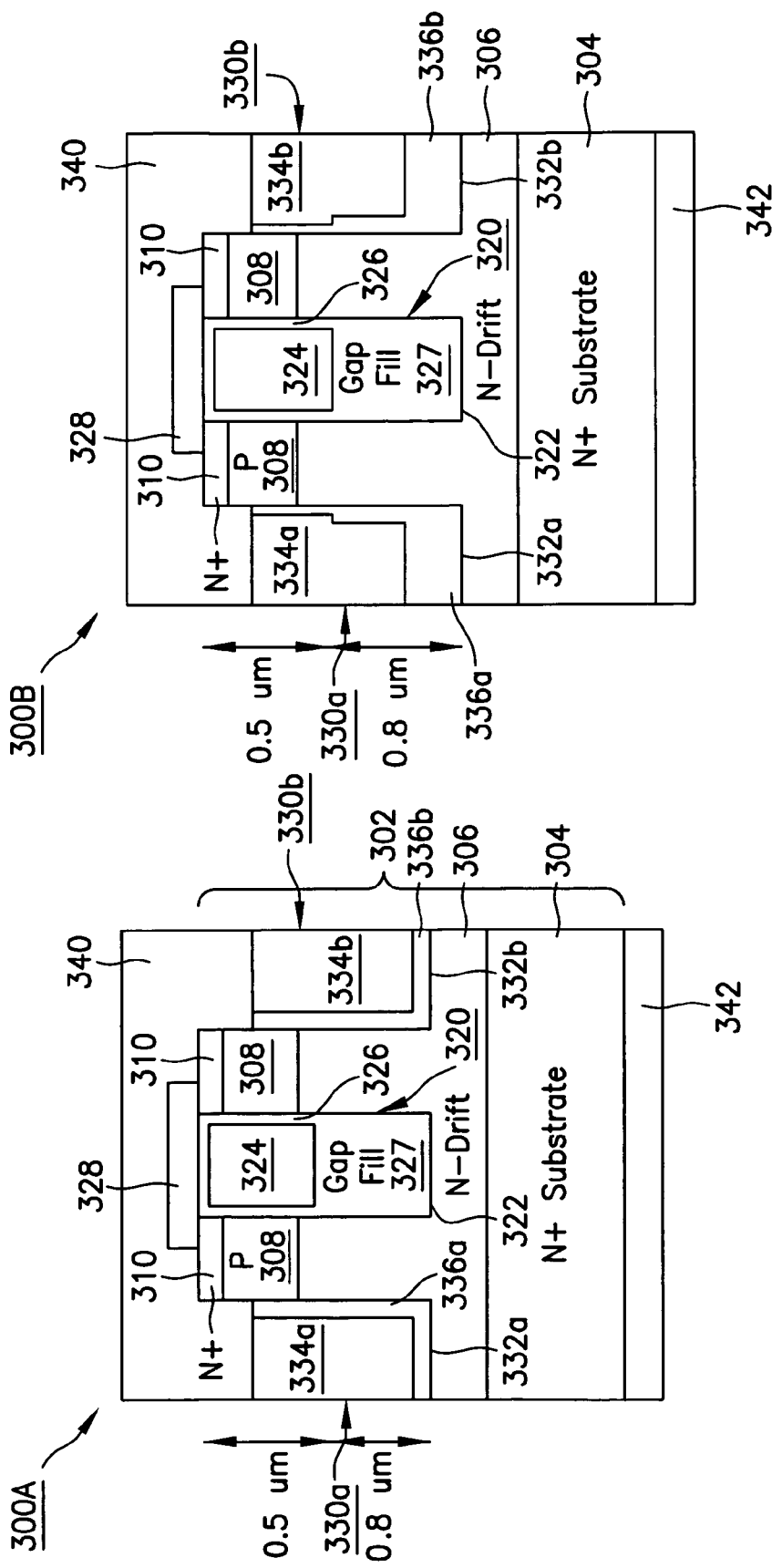

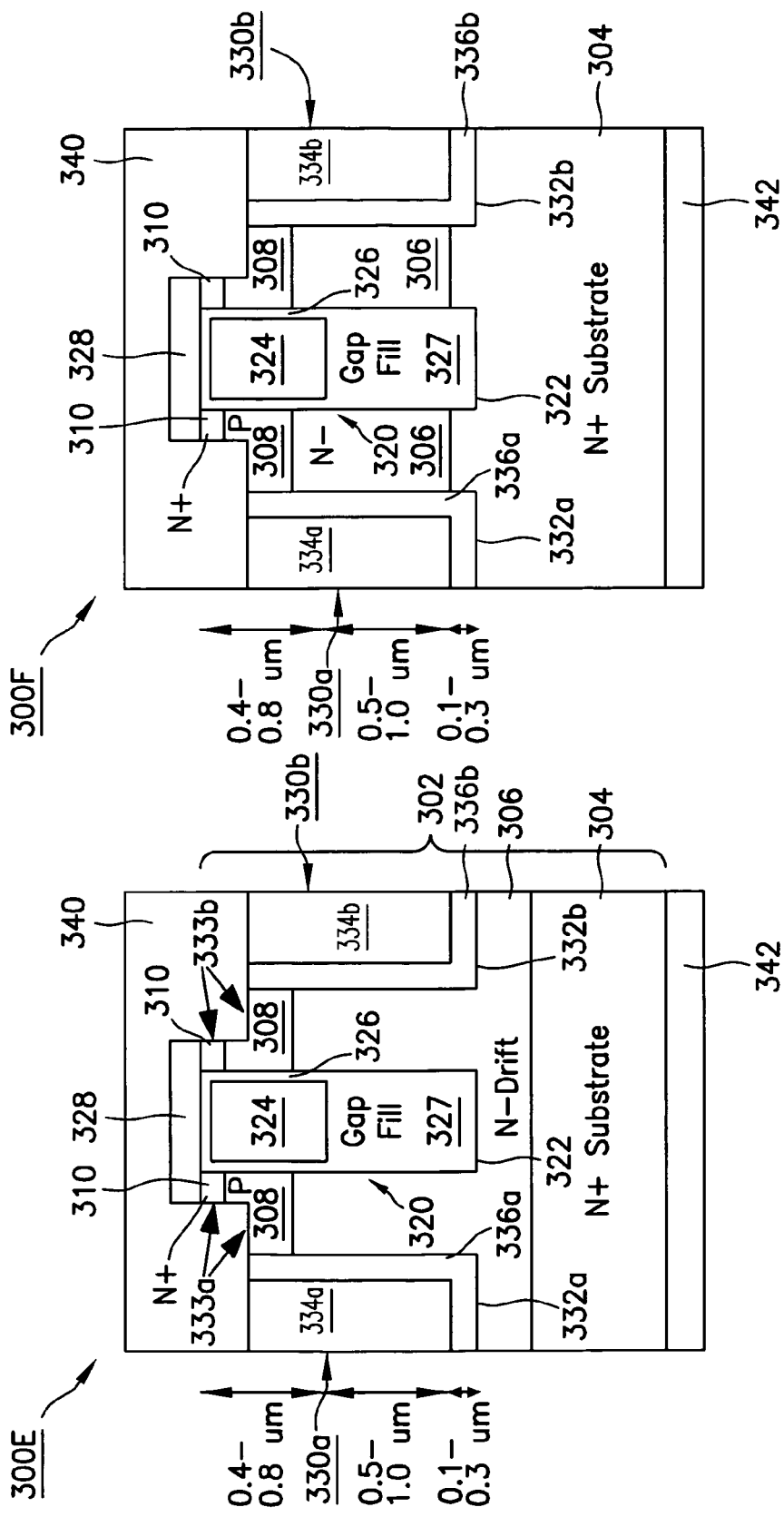

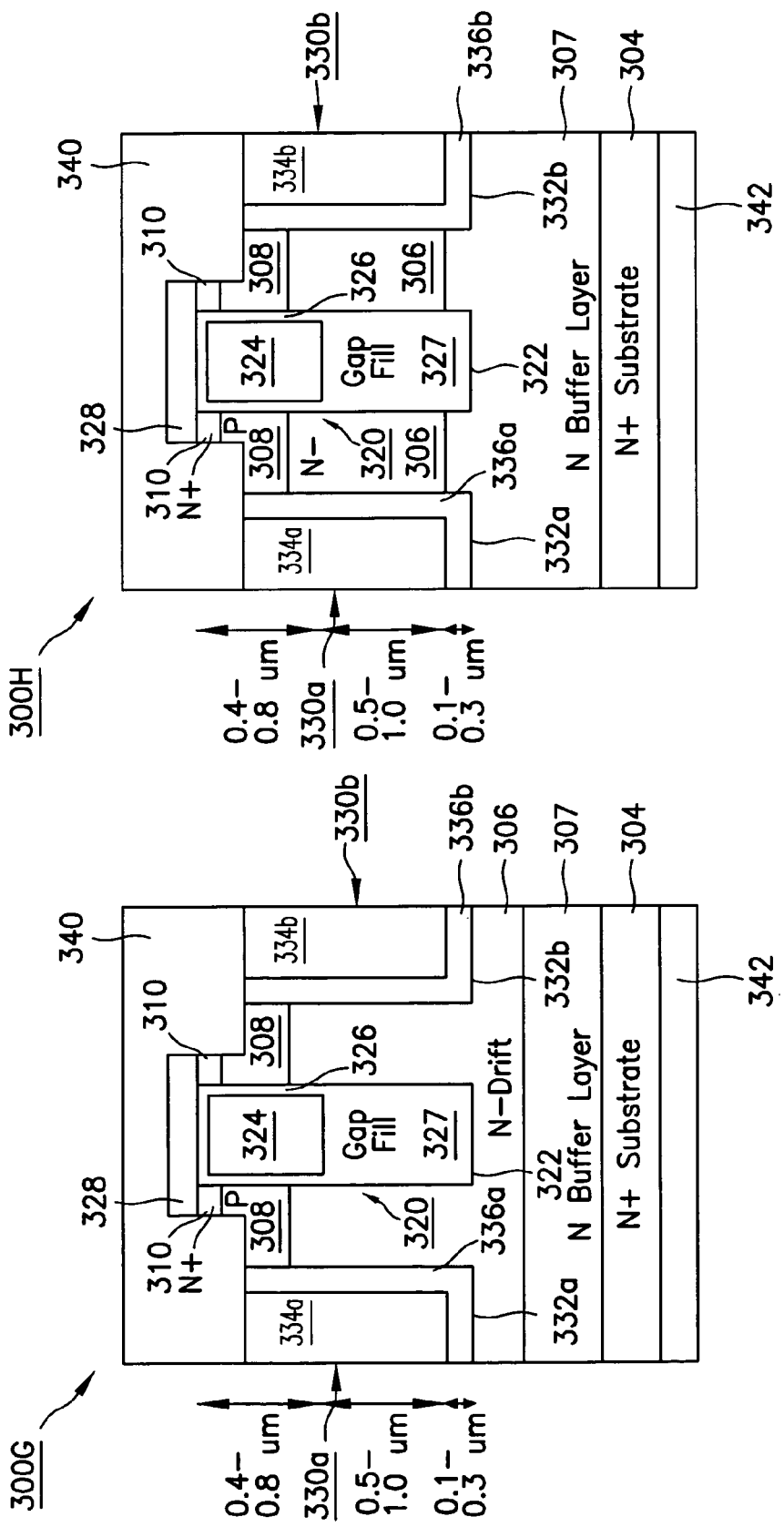

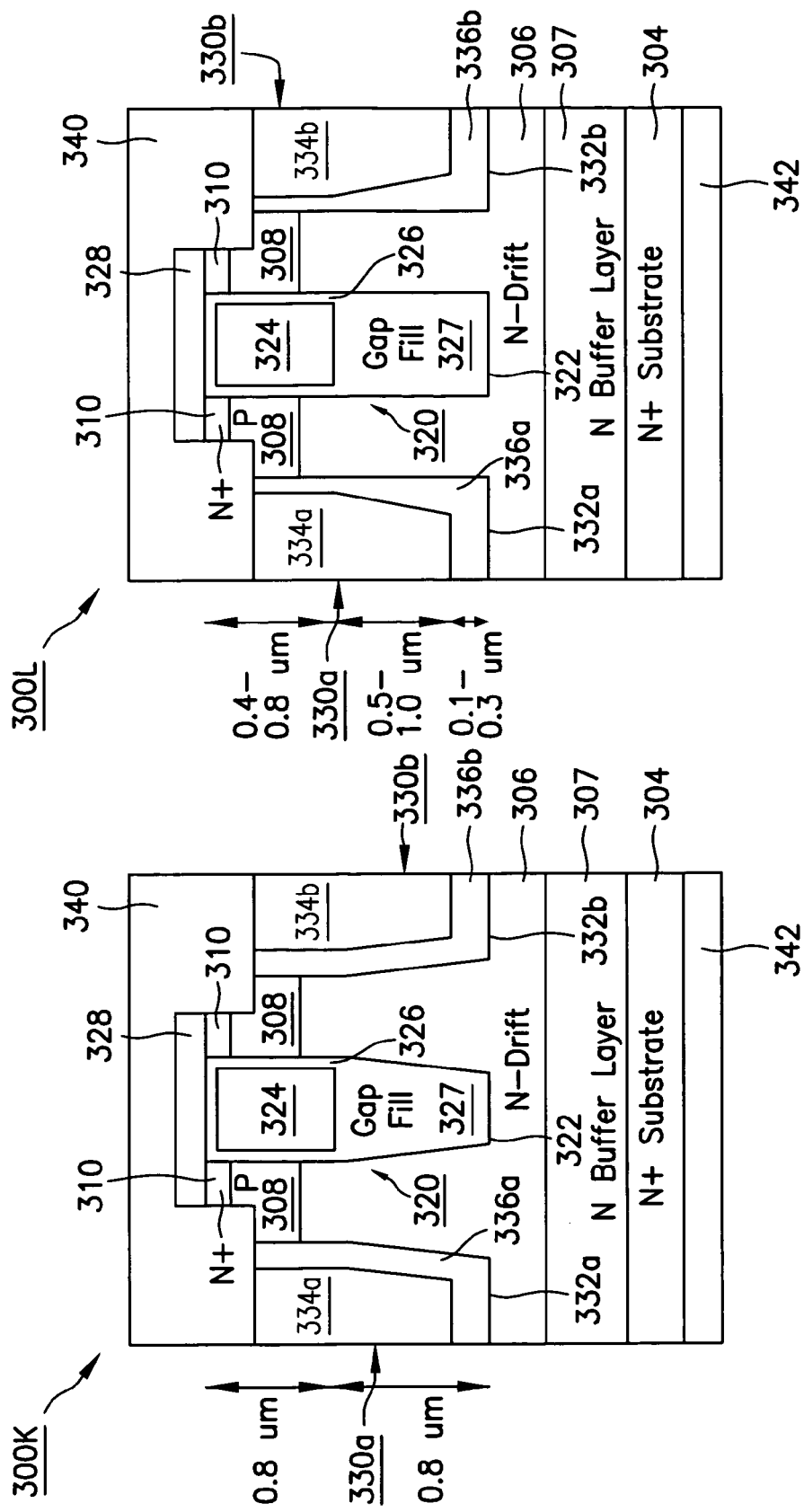

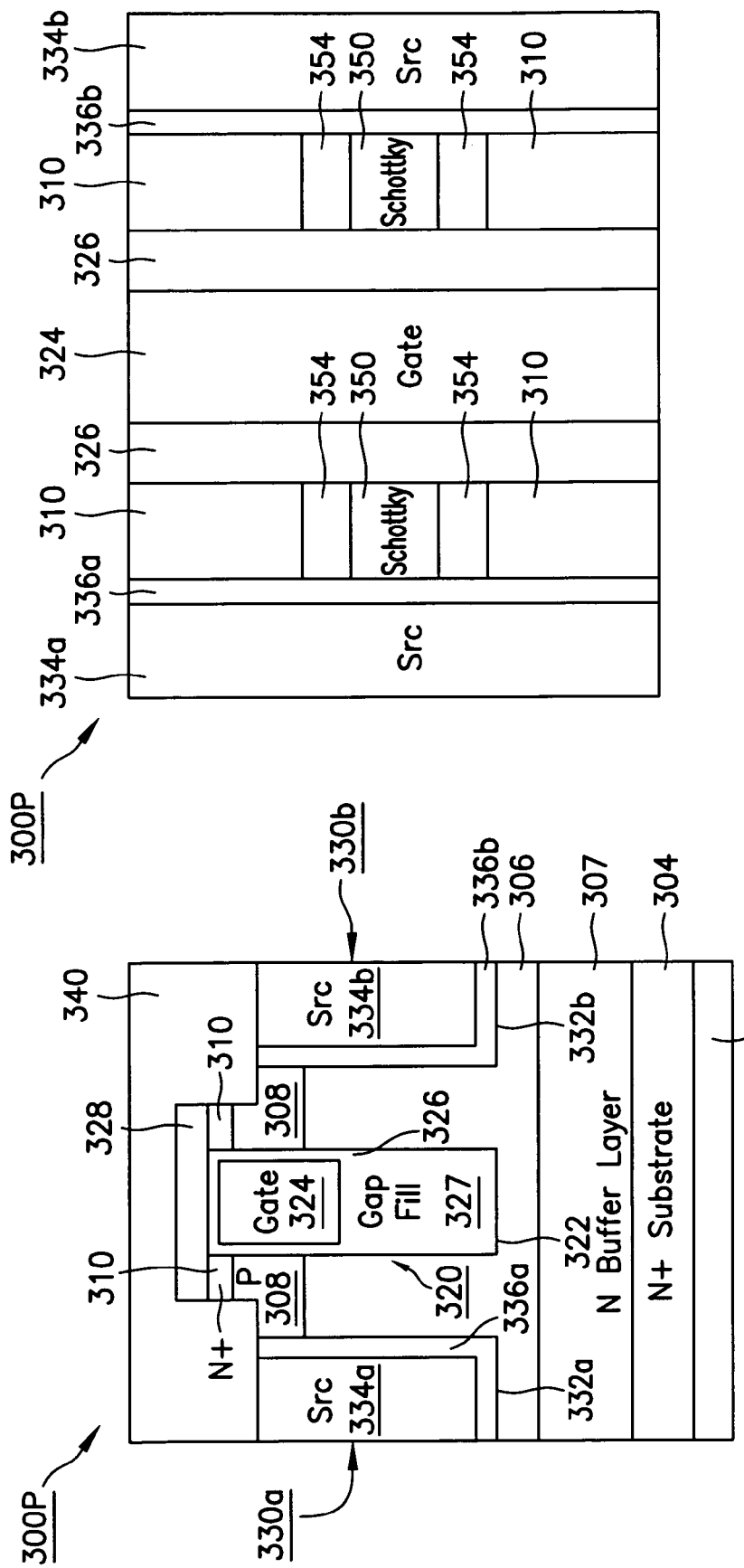

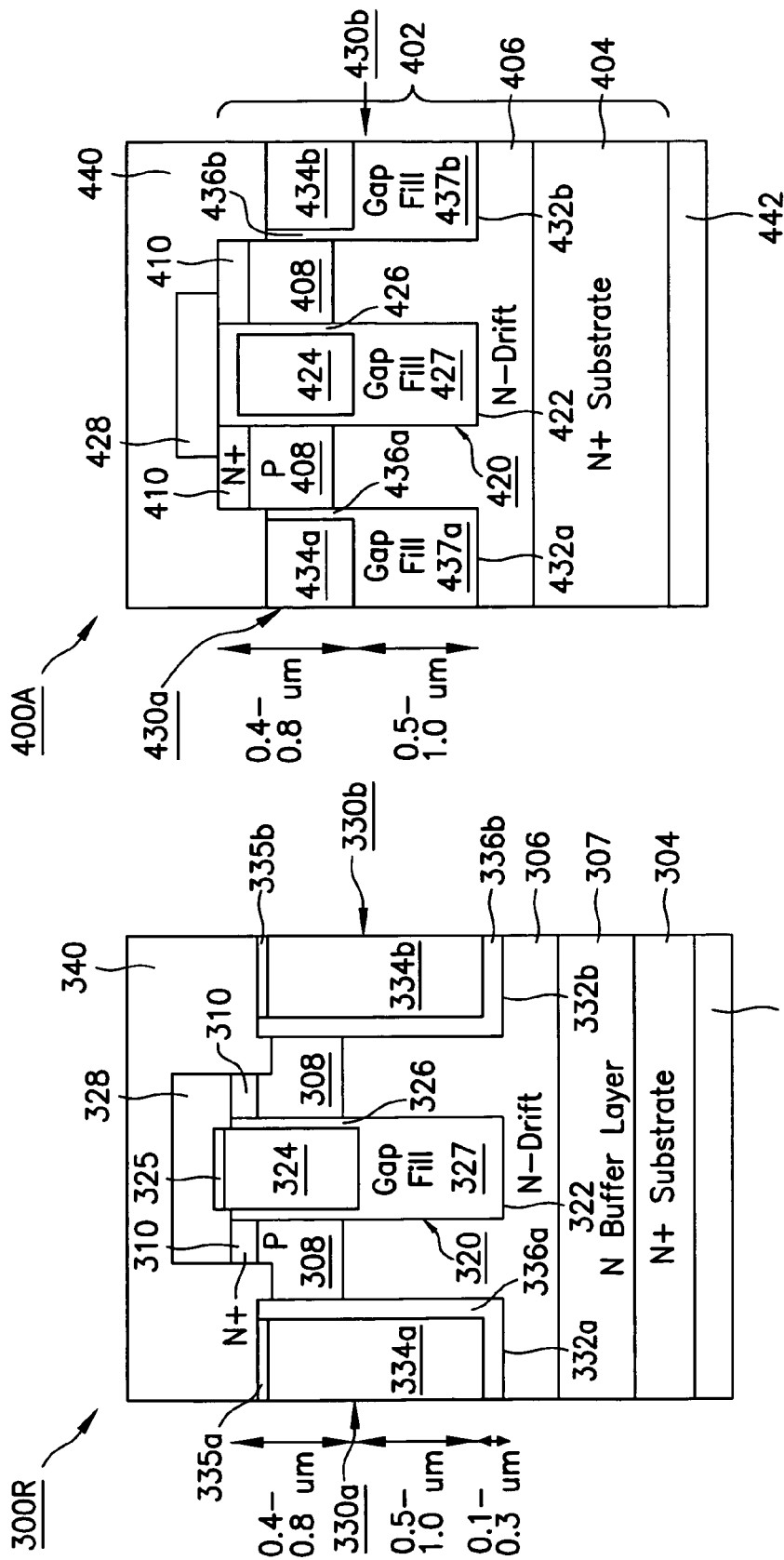

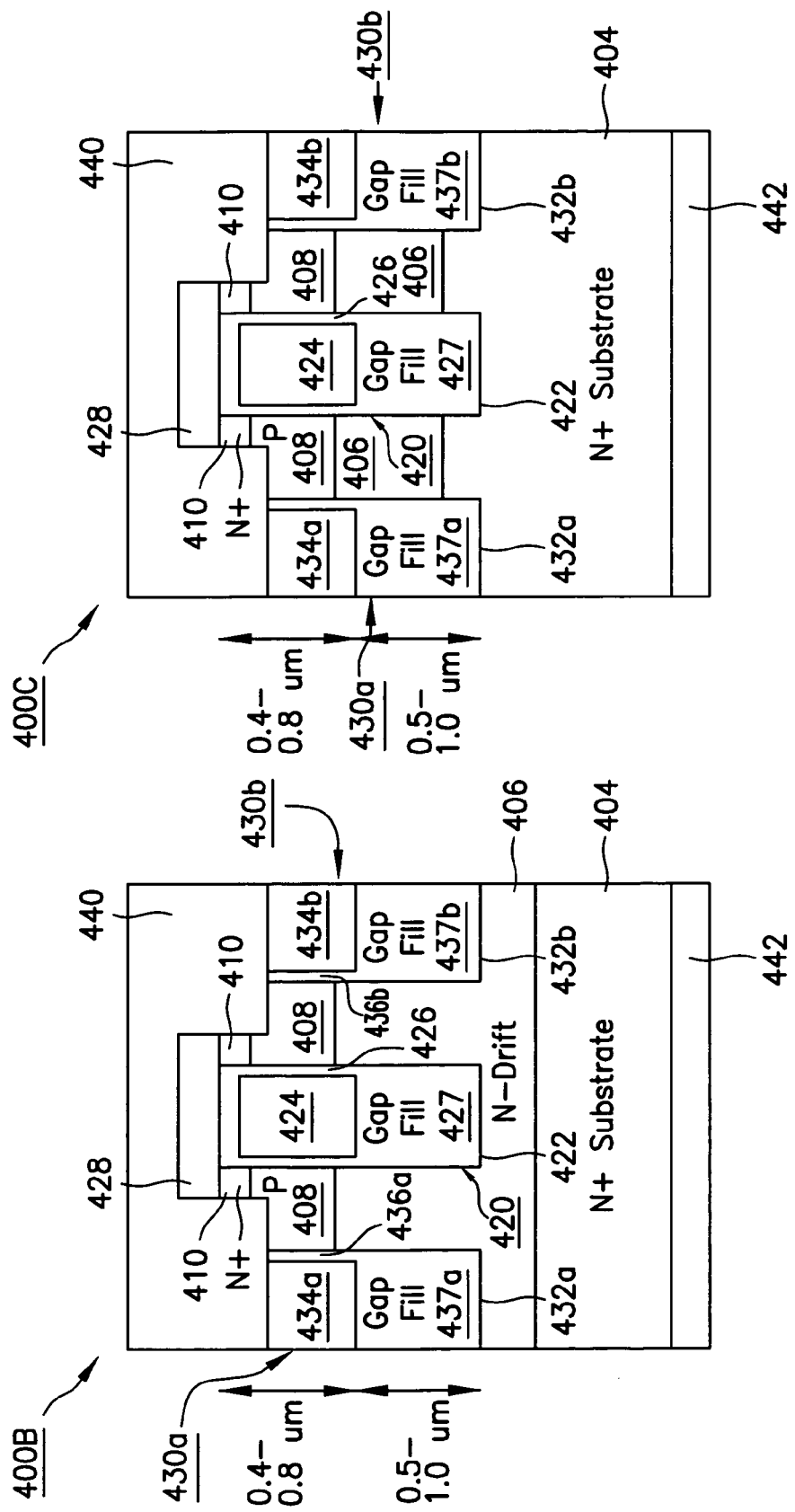

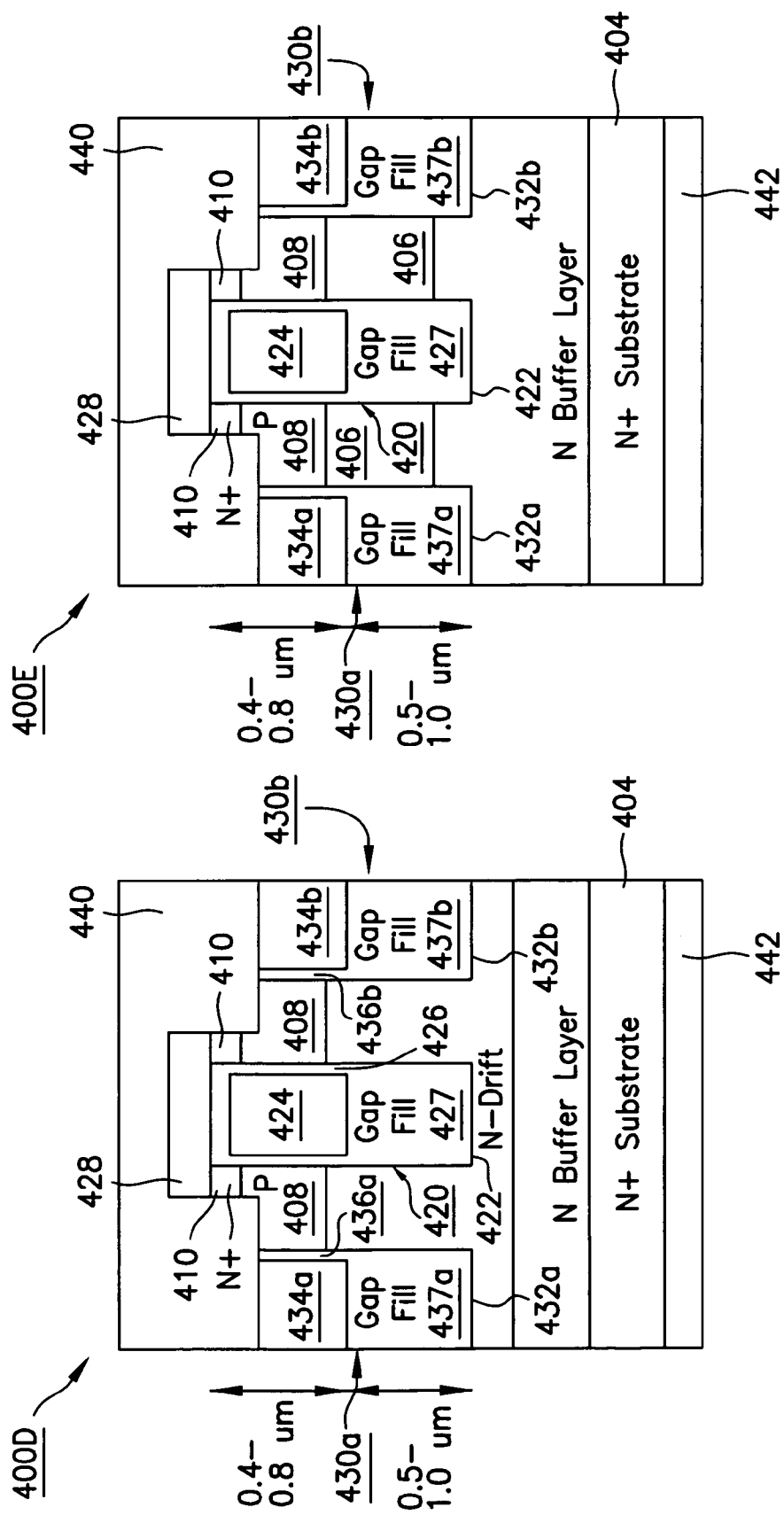

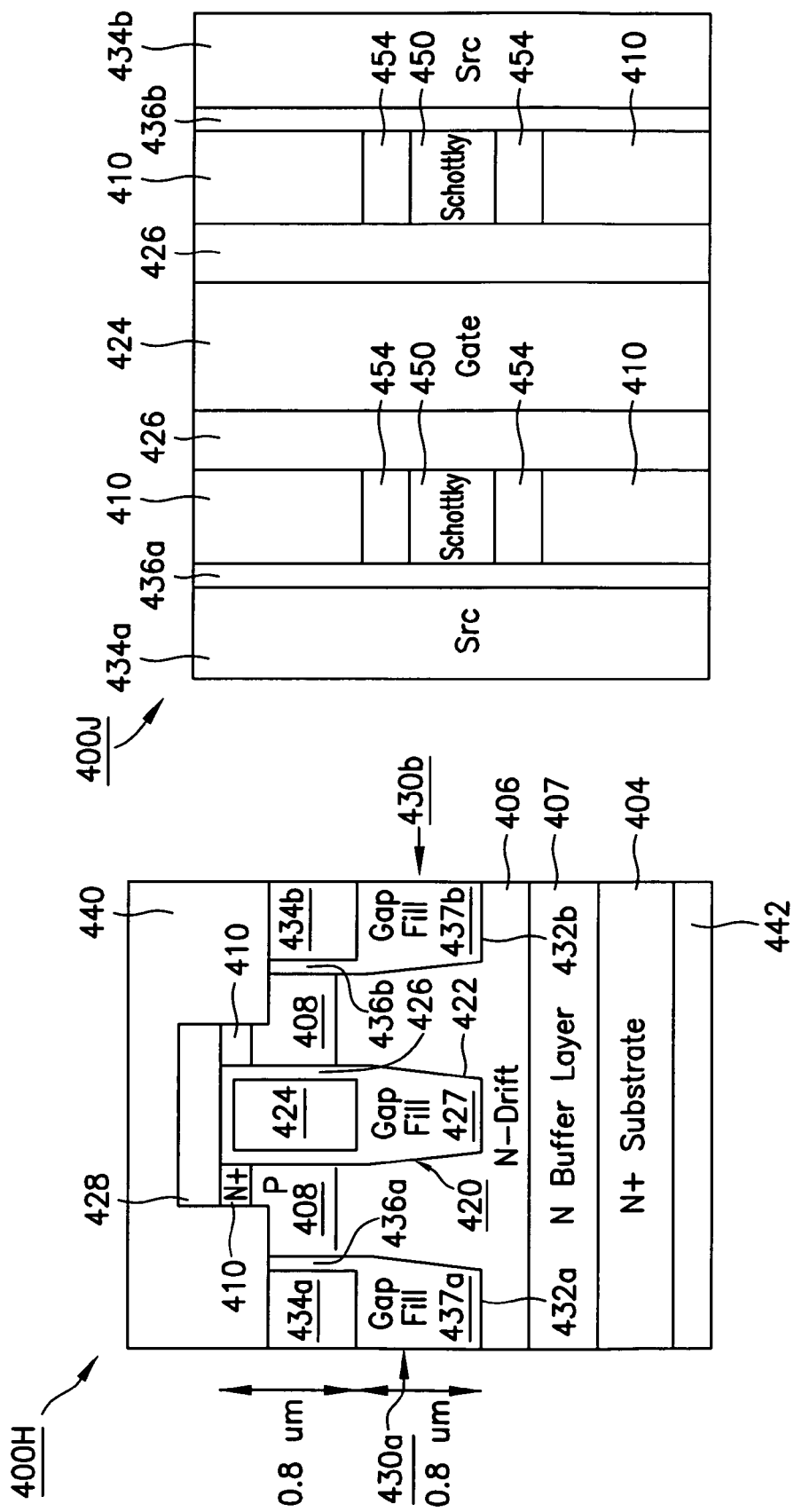

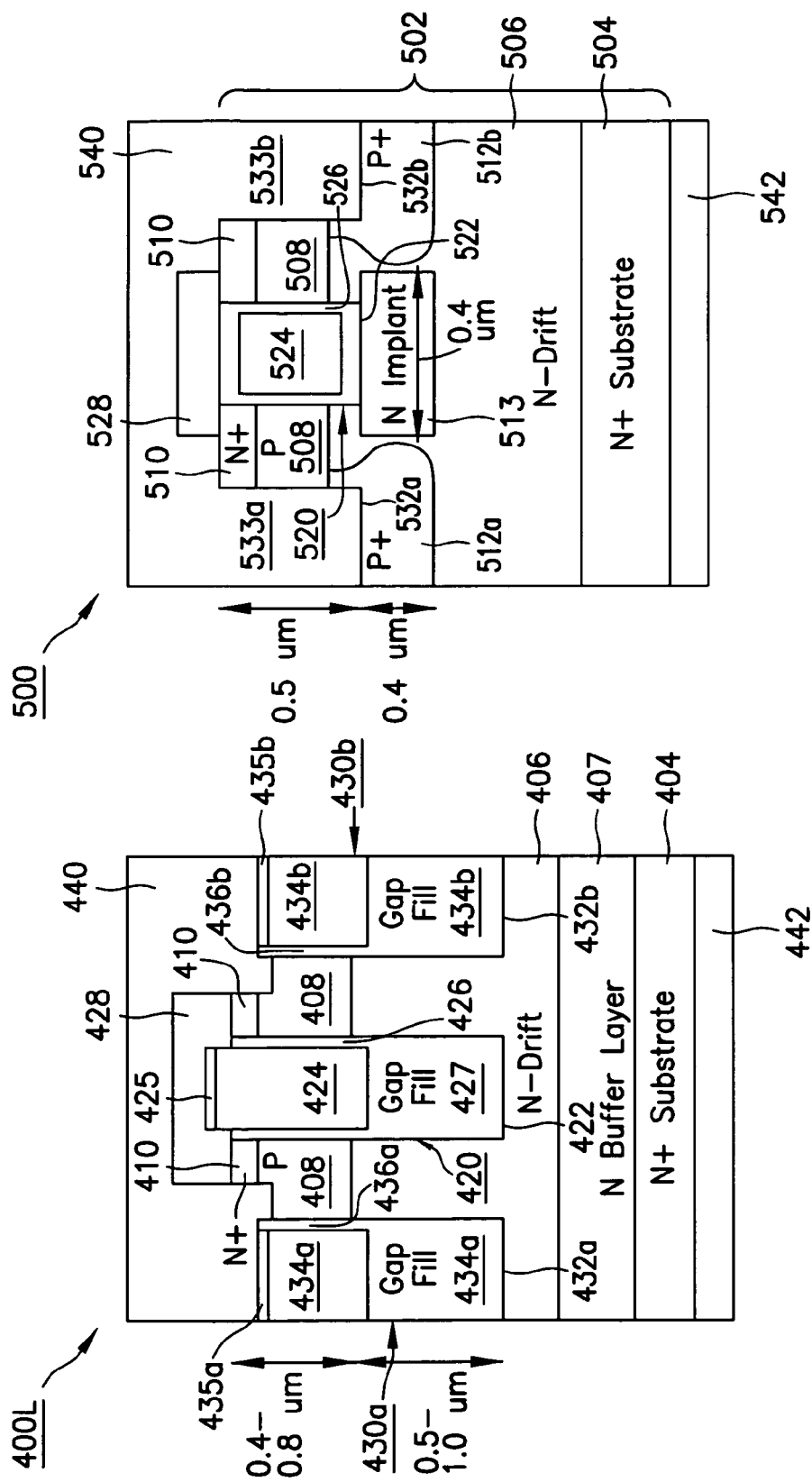

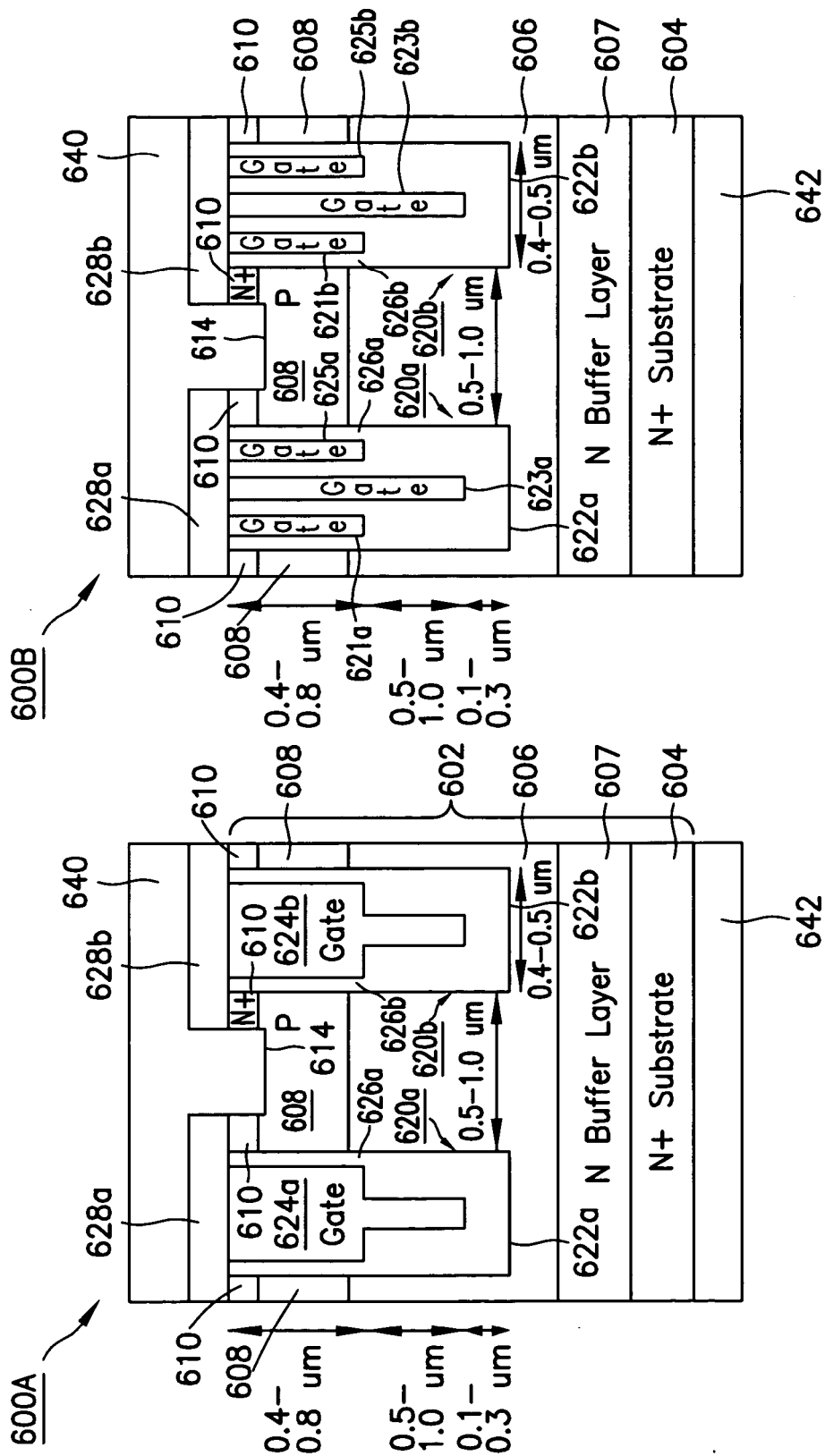

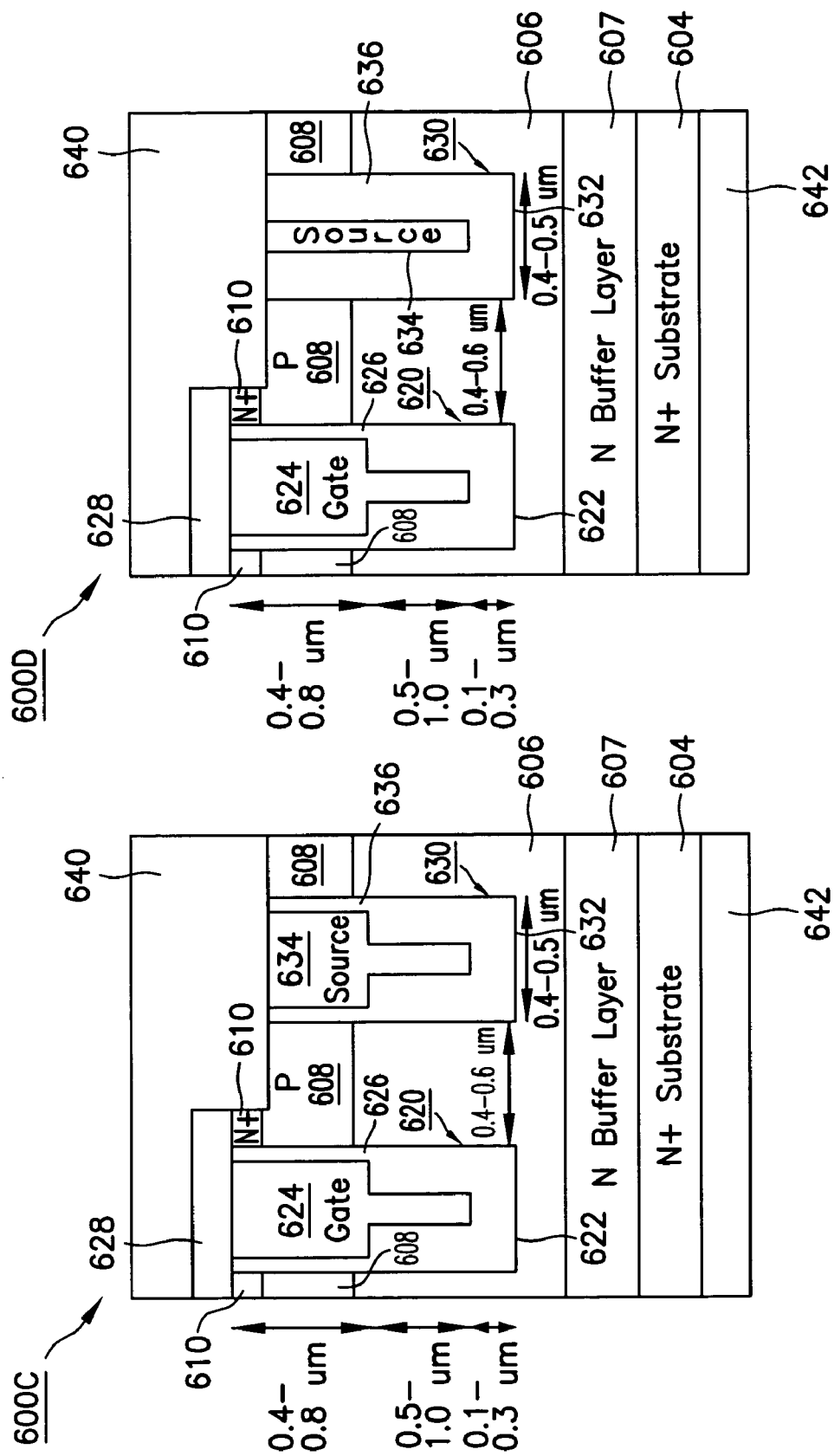

US 7,465,986 B2

POWER SEMICONDUCTOR DEVICE INCLUDING INSULATED SOURCE ELECTRODES INSIDE TRENCHES

RELATED APPLICATIONS

This application is based on and claims priority to U.S. Provisional Application No. 60/605,340, filed on Aug. 27, 2004, by Dev Alok Girdhar, entitled, "LOW VOLTAGE MOSFET," the contents of which are herein incorporated by reference.

BACKGROUND OF THE INVENTION

1. Field of the Invention

The present invention relates generally to semiconductor devices, and more specifically, to trench type power semiconductor devices.

2. Description of Related Art

Trench type power semiconductor devices such as power MOSFETs are well known. As is also known, one objective in designing these devices is to obtain a low on-resistance while also obtaining a high maximum blocking voltage, also referred to as breakdown voltage. For example, referring to FIG. 1A, which is a reproduction of FIG. 5 from U.S. Pat. No. 6,649,975, by B. J. Baliga, there is shown a prior art power MOSFET 100A. (Note that S. Sapp describes a similar device in U.S. Pat. No. 6,710,403). MOSFET 100A includes a semiconductor body 102 with a plurality of interleaved source and gate trenches formed therein, such as source trenches 132a/132b and gate trench 122. Semiconductor body 102 includes a highly doped drain region 104 of first conductivity type (e.g. N-type), a drift region 106 having a linear graded doping concentration of the same conductivity type, a channel region 108 (also referred to as a body region) of second conductivity type opposite to that of the first conductivity type (e.g., P-type), and a source region 110 of the first conductivity type.

Gate trench 122 extends within semiconductor body 102 to a depth below the bottom of channel region 108 and includes a conductive gate electrode 124 therein. Gate electrode 124 extends above and below the channel region and is insulated from semiconductor body 102 by gate insulation layer 126, which lines the side-wall and bottom of the gate trench.

Source trenches 132a/132b extend within drift region 106 of semiconductor body 102 to a depth below the bottom of gate trench 122. Within the source trenches are source electrodes 134a/134b that extend to a depth below the bottom of gate electrode 124. Source insulation layers 136a/136b line the side-wall and bottom of the source trenches and insulate the source electrodes from drift region 106.

A source contact 140 is formed over the top surface of semiconductor body 102 and electrically contacts source region 110 and source electrodes 134a/134b. Source contact 140 also contacts channel region 108 along the top surface of the device in the third dimension. A gate insulation cap 128 insulates gate electrode 124 from the source contact. A drain contact 142 is formed over the bottom surface of semiconductor body 102 and electrically contacts drain region 104.

When MOSFET 100A is operated in an on state, a gate voltage is applied to gate electrode 124. When this voltage reaches a threshold value, a vertical inversion-layer channel forms within channel region 108 along the side-wall of gate trench 122. This inversion-layer channel has the same conductivity as source region 110 and drift region 106. As a result, a current flows between source electrode 140 and drain electrode 142.

As described by Baliga, when MOSFET 100A is in an off, source electrodes 134a/134b help to improve the breakdown voltage of the device. In particular, as a reverse voltage is applied across the drain and source contacts, a depletion layer is formed as a result of the reversed-biased channel-drift junction. Because the source electrodes are in contact with the source contact, a voltage forms on these electrodes that causes the depletion layer to get pushed/spread away from the channel region and deeper into the drift region, thereby improving the blocking voltage of the device.

Notably, the source electrodes also improve the on-resistance of the device, allowing for a more highly doped drift region 106. In other words, the source electrodes allow a more highly doped drift region to now support a higher breakdown voltage than would have otherwise been possible.

Referring now to FIG. 1B, which is a reproduction of FIG. 3 from U.S. Pat. No. 5,673,898 by B. J. Baliga, there is shown another prior art power MOSFET 100B. Device 100B has a semiconductor body 102 similar to that described above, including a drift region 106 with a linear graded doping concentration that increases from channel region 108 towards drain region 104. Gate trenches, such as trench 150, are formed within the semiconductor body and extend to a depth within the drift region. A gate electrode 152 is disposed within the gate trench and is insulated from source region 110, channel region 108, and drift region 106 by gate insulation layer 154. As shown in FIG. 1B, the gate insulation layer 154 has non-uniform thickness between the trench side-wall and the gate electrode, the insulation layer being thicker along the portion of the side-wall adjacent to the drift region as compared to the portion adjacent to the channel region (this thinner insulation layer helping to maintain a low threshold voltage). A drain contact 142 is formed over the bottom surface of the semiconductor body along drain region 104. A source contact 140 is formed over the top surface of semiconductor body 102, electrically contacting source region 110. Source contact 140 also contacts channel region 108 in the top surface of the device in the third dimension.

As described by Baliga, MOSFET 100B also has improved breakdown voltage and on-resistance. In particular, the increased thickness of the gate insulation layer along the drift region improves the forward voltage blocking capability of the device by preventing high electric field crowding at the bottom corners of the trench. In addition, the increased doping of the drift region towards the drain region improves the on-resistance of the device while the reduced doping of the drift region towards the channel region improves the breakdown voltage of the device by inhibiting the occurrence of reach-through breakdown across the channel region. Nonetheless, device 100B may have a large gate-drain charge (Qgd) thereby causing a low high-frequency figure-of-merit (HFOM).

Referring now to FIG. 1C, which is a reproduction of FIG. 3 from U.S. Pat. No. 5,998,833 by B. J. Baliga, there is shown another prior art power MOSFET 100C, which is a variation of device 100B. Device 100C has a semiconductor body 102 similar to that described above, including a drift region 106 with a linear graded doping concentration. Trenches, such as trench 160, are formed within the semiconductor body and extend to a depth within the drift region. A gate electrode 162 is disposed within the upper portion of the trench adjacent channel region 108, thereby allowing for the formation of an inversion layer during the on state. A source electrode 164 is disposed in the lower portion of the trench adjacent drift region 106. An insulation layer 166 insulates the gate and source electrodes from each other and from the source region 110, channel region 108, and drift region 106. As shown in FIG. 1C, the insulation layer 166 has non-uniform thickness, being thicker along the trench side-wall and bottom adjacent to the drift region, thereby preventing high electric field crowding at the bottom corners of the trench, as similarly described above. A drain contact 142 is formed over the bottom surface of the semiconductor body along drain region 104. A source contact 140 is formed over the top surface of semiconductor body 102, electrically contacting source region 110. Source contact 140 also contacts source electrode 164 and channel region 108 in a third dimension (not shown).

As described by Baliga, as compared to device 100B, the inclusion of source electrode 164 improves the breakdown voltage of the device, the source electrode operating as similarly described for device 100A. In addition, because gate electrode 162 has a reduced size, the gate charge (Qg) and gate-drain charge (Qgd) are reduced, thereby improving the high-frequency figure-of-merit. However, as compared to device 100B, the on-resistance of device 100C is greater. In addition, it can be difficult to make contact between buried source electrode 164 and source contact 140.

In general, it is desirable to further improve the on-resistance and breakdown voltage, among other device characteristics, of a trench-type power semiconductor devices, like those shown in FIGS. 1A, 1B, and 1C.

SUMMARY OF THE INVENTION

According to a first embodiment of the invention, an example power semiconductor device includes a semiconductor body with a highly doped drain region, a drift region of lower concentration of impurities than the drain region, and a highly doped source region, each of a first conductivity type, and a channel region of a second conductivity type disposed between the source and drift regions. The drift region may by uniformly doped or doped in a monotonically increasing fashion from the channel region towards the drift region, the variable doping improving the breakdown voltage and on-resistance of the device.

The semiconductor device further includes a plurality of gate trenches and a plurality of source trenches with substantially vertical side-walls formed within the semiconductor body. A gate/source insulation layer lines the side-wall and bottom of each gate and source trench. Within each gate trench is a conductive insulated gate electrode and within each source trench is a conductive insulated source electrode, the gate and source electrodes being composed of conductive polysilicon, for example. The gate and source trenches and electrodes may be interleaved in an alternating fashion and may be formed in either a cellular design or a strip design. Notably, the cellular design increases the charge coupling between the source and drift regions, thereby reducing the on-resistance of the device.

According to this embodiment of the invention, the gate and source trenches extend to within the drift region, for example, with the source trenches extending to a greater depth than the gate trenches. In addition, the source and gate electrodes extend towards the bottom of their respective trenches, with the source electrodes extending to within the drift region and extending a greater depth than the gate electrodes.

The semiconductor device further includes a drain contact along the bottom surface of the semiconductor body in electrical contact with the drain region. The device also includes a source contact along the top surface of the semiconductor body and in contact with the source region, the source contact also filling an upper portion of the source trenches and in contact with an exposed top surface of the source electrodes.

Notably, an etched surface of the channel region is exposed along an upper portion of the source trenches. Accordingly, the source contact also contacts the channel region along this upper portion of the source trenches.

Notably, the trench-based source electrodes of the device provide an improved breakdown voltage by pushing the depletion region further into the drift region when the device is in the off-state. In addition, by having the source contact contact the channel region along the upper portion of the source trenches, the cell pitch of the device is reduced.

According to a variation of the above embodiment of the invention, the side-wall of the source trenches may slope inward substantially along the drift region rather than extend vertically downward. This slope causes the drift region to increase in area between the source trenches as the drift region descends away from the channel region towards the drain region. As a result, the charge within the drift region increases as the drift region descends away from the channel region, this increased charge improving the on-resistance of the device.

According to another variation of the above embodiment of the invention, the source insulation layer that lines the side-wall of the source trenches varies/increases in thickness along a substantial portion of the drift region as the insulation layer descends away from the channel region. The insulation layer may increase in thickness in either a sloping fashion or a stepwise fashion. As a result of the varying thickness of the insulation layer, the source electrodes decrease in width and move away from the side-wall of the source trenches (in either a sloping or stepwise fashion) as the electrodes descend along the drift region. By varying/increasing the insulation layer thickness in this fashion, the coupling between the source electrodes and the drift region is reduced.

According to a second embodiment of the invention, an example power semiconductor device is as similarly described above and includes a semiconductor body with a plurality of source trenches and gate trenches with substantially vertical side-walls formed therein, the side-wall and bottom of the trenches being lined with a source/gate insulation layer. According to this embodiment of the invention, however, the gate trenches now extend to within the drift region, for example, to the same depth as the source trenches. A conductive insulated source electrode is disposed within each source trench and a conductive insulated gate electrode is disposed within each gate trench. The source electrodes extend towards the bottom of the source trenches to within the drift region. However, according to this embodiment of the invention the gate electrodes do not extend towards the bottom of the gate trenches and in particular, extend to a shallower depth than the source electrodes. Accordingly, a gate insulation plug is disposed beneath the bottom of each gate electrode and the bottom of its respective gate trench, thereby filling the gap.

According to another variation of the above embodiment of the invention, rather than each gate trench including a gate insulation plug beneath the gate electrode, each gate trench includes a second conductive insulated gate electrode disposed between the bottom of the first gate electrode and the bottom of the gate trench. The two gate electrodes are insulated from each other within the gate trench. The first gate electrode is connected to a gate contact. The second gate electrode may either float or be connected to the gate electrode.

According to another variation of the above embodiment of the invention, rather than the side-wall of the source trenches and gate trenches being substantially vertical, the side-wall slopes inward though the source and channel regions and along the drift region. Alternatively, the side-wall of the source trenches and gate trenches are substantially vertical through the source and channel regions, thereby shortening the channel region, and thereafter slope inward along the drift region. As similarly described above, this slope of the trench side-wall causes the drift region to increase in area between the gate trenches and adjacent source trenches as the drift region descends away from the channel region. As a result, the charge within the drift region increases, improving the on-resistance of the device.

According to another variation of the above embodiment of the invention, the source insulation layer that lines the side-wall of the source trenches varies/increases in thickness (in either a sloping fashion or a stepwise fashion) along a substantial portion of the drift region as the insulation layer descends away from the channel region. As similarly described above, this varying thickness of the insulation layer results in the source electrodes decreasing in width and moving away from the side-wall of the source trenches as the electrodes descend along the drift region, thereby reducing the coupling between the source electrodes and the drift region.

According to another variation of the above embodiment of the invention, rather than each source trench having a single source electrode disposed therein, each source trench now includes multiple source electrodes of varying lengths disposed therein. Specifically, for each source trench a source electrode extends down the center of the trench towards the trench bottom, as similarly described above. Additional source electrodes also extend along the side-wall of each source trench, adjacent the center source electrode. These additional electrodes, however, do not extend towards the bottom of the source trench and in particular, extend to a shallower depth than the center source electrode. For example, these additional source electrodes may extend to the same depth as the gate electrodes. An insulation layer within the source trench insulates the multiple source electrodes from each other and from the drift region, the insulation layer having an increased thickness substantially along the drift region. Notably, the source contact electrically contacts each of the source electrodes within a source trench.

According to another variation of the above embodiment of the invention, a plurality of Schottky contacts are also formed along the surface of the semiconductor device, thereby forming a power semiconductor device with integrated Schottky diodes. Here, the source and gate trenches and electrodes may have any of the forms described above.

According to another variation of the above embodiment of the invention, a plurality of P-N diodes are also formed within the semiconductor device creating a device with an interleaved arrangement of MOSFETs and P-N diodes, for example. The P-N diodes help to prevent avalanche breakdown of the device when in the off state. Here, the source and gate trenches and electrodes may have any of the forms described above.

According to another variation of the above embodiment of the invention, the source electrodes and/or gate electrodes of the above described devices may extend above a surface of semiconductor body (forming proud electrodes), thereby reducing the resistance of the electrodes. The top of the gate and source electrodes may also be silicided, thereby forming silicide contacts that reduce the sheet resistance of the electrodes.

According to an embodiment of the invention, the bottom of the source and gate trenches of the above described example semiconductor devices may extend to within the drift region and in particular, may extend to a depth such that a portion of the drift region extends below the bottom of the trenches. Here, the drift region may either by uniformly doped or doped in a monotonically increasing fashion towards the drain region. According to another embodiment of the invention, the source and gate trenches of the above described example devices may extend to within the drain region, such that there is no drift region beneath the bottom of the trenches. According to another embodiment of the invention, a buffer region of the first conductivity type may be disposed between the drift region and drain region to improve the breakdown voltage of the device. Here, the source and gate trenches may either extend to within the drift region above the buffer region or may extend through the drift region and into the buffer region.

According to a third embodiment of the invention, an example power semiconductor device is as similarly described above and includes a semiconductor body with a plurality of source trenches and gate trenches with substantially vertical side-walls formed therein, the source and gate trenches extending within the drift region, for example, to the same depth. The source and gate trenches are lined with an insulation layer. In addition, a conductive insulated source electrode is disposed within each source trench and a conductive insulated gate electrode is disposed within each gate trench, the electrodes extending for example, to within the drift region. According to this embodiment of the invention, however, the source and gate electrodes extend to substantially the same depth and in addition, do not extend to the bottom of their respective trenches. Accordingly, a source insulation plug is disposed beneath the bottom of each source electrode in order to fill the gap and a gate insulation plug is disposed beneath the bottom of each gate electrode in order to fill the gap.

Similar to the second embodiment of the invention described above, alternative embodiments of this third embodiment include power semiconductor devices having source trench side-walls and gate trench side-walls that slope inward substantially along the drift region to increase the charge within the drift region. Similarly, a plurality of Schottky contacts may be formed along the surface of the device, thereby forming a power semiconductor device with integrated Schottky diodes. Alternatively, a plurality of P-N diodes may be formed within the device creating a device with an interleaved arrangement of MOSFETs and P-N diodes, for example. Similarly, the source electrodes and/or gate electrodes may be proud and may be silicided. Furthermore, the drift region may be uniformly doped or doped in a monotonically increasing fashion or a buffer region may be added. Again, the source and gate trenches may have varying depths to within the drift region, buffer region, and drain region.

According to a fourth embodiment of the invention, an example power semiconductor device has a semiconductor body with a plurality of alternating source trenches and gate trenches formed therein that extend from the surface of the semiconductor body through the source and channel regions and into the drift region, for example. Here, the source and gate trenches extend to the same depth. Each gate trench is lined with a gate insulation layer and has an conductive insulated gate electrode of polysilicon, for example, disposed therein. However, rather than the source trenches being lined with an insulation layer and having a polysilicon electrode formed therein, the source contact metal over the surface of the device fills the source trenches, forming source electrodes therein. The device also includes first highly doped implant regions of the second conductivity type formed within the drift region along the lower side-wall and bottom of the source trenches. These implant regions extend a significant distance below the depth of gate trenches and also extend laterally towards one another. The device further includes second doped implant regions of the first conductivity type formed within the drift region below the gate trenches and between the first implant regions. Notably, the source electrodes operate similar to the trench-based source electrodes as described above, providing an improved breakdown voltage for the device.

According to a fifth embodiment of the invention, an example power semiconductor device has a semiconductor body with a plurality of alternating source contact trenches and gate trenches formed therein. The source contact trenches extend from the surface of the semiconductor body through the source region and into the channel region providing an etched surface of both regions. The source contact metal applied to the surface of the semiconductor body fills the source contact trenches and in this way, contacts both the source and channel regions.

The gate trenches extend from the surface of the semiconductor body through the source and channel regions and into the drift region, for example. Each gate trench is lined with an insulation layer of non-uniform thickness along the side-wall and bottom of the trench, the insulation layer being thinner along the channel region and thicker along the drift region. A gate electrode is disposed within each gate trench and extends within the drift region, for example, towards the bottom of the trench. Each gate electrode has varying widths as a result of the non-uniform insulation layer, the electrode having a wider width adjacent the channel region and a thinner width adjacent the drift region.

According to a variation of the above embodiment of the invention, rather than each gate trench having a single gate electrode disposed therein, each gate trench now includes multiple gate electrodes of varying lengths disposed therein. Specifically, for each gate trench a gate electrode extends down the center of the trench towards the trench bottom, as similarly described above. Additional gate electrodes, such as two, also extend along the side-wall of each gate trench, adjacent the center gate electrode and the channel region. These additional electrodes, however, do not extend towards the bottom of the gate trench and in particular, extend to a shallower depth than the center gate electrode. An insulation layer within the gate trench insulates the multiple gate electrodes from each other and from the semiconductor body, the insulation layer having varying thickness as described above. Each gate electrode within a gate trench is connected to a gate contact.

According to another embodiment of the invention, an example power semiconductor device has a semiconductor body with a plurality of alternating source trenches and gate trenches formed therein that extend to within the drift region, for example, to the same depth. Each gate trench is lined with an insulation layer of non-uniform thickness along the channel region and drift region, as similarly described above. A gate electrode of non-uniform width is disposed within each gate trench, the electrode having a wider width adjacent the channel region and a thinner width adjacent the drift region, as similarly described above.

According to one embodiment of the invention, each source trench is lined with an insulation layer of non-uniform thickness similar to the gate trenches, the insulation layer being thinner along the channel region and thicker along the drift region. A source electrode is disposed within each source trench and extends towards the bottom of the source trench to the same depth as the gate electrodes. Each source electrode has varying widths similar to the gate electrodes, the source electrode having a wider width adjacent the channel region and a thinner width adjacent the drift region. According to another embodiment of the invention, the insulation layer along the source trench side-wall has uniform thickness throughout and is relatively thick along both the channel and drift regions. Accordingly, the source electrode also has a uniform width throughout and is relatively thin along both the channel and drift regions.

According to either embodiment of the invention, each source electrode contacts the source contact. In addition, the source contact also contacts the channel region along an upper portion of the source trenches.

According to a variation of the above embodiment of the invention, rather than each gate trench and each source trench having a single gate or source electrode disposed therein, as just described, each gate trench now includes multiple gate electrodes of varying lengths and each source electrode includes multiple source electrodes of varying lengths. The multiple gate electrodes may include a center electrode that extends down the center of the gate trench towards the trench bottom and may also include two side electrodes that extend adjacent the center electrode along the sides of the trench and adjacent to the channel region. The side electrodes, however, do not extend towards the bottom of the gate trench and in particular, extend to a shallower depth than the center gate electrode. An insulation layer within the gate trench insulates the multiple gate electrodes from each other and from the semiconductor body. Each gate electrode within a gate trench is connected to a gate contact.

The multiple source electrodes are similar to the multiple gate electrodes and may include a center electrode that extends down the center of the source trench towards the trench bottom and may also include two side electrodes that extend adjacent the center electrode along the sides of the trench, but to a shallower depth than the center electrode. The center source and gate electrodes and the side source and gate electrodes may each extend to the same depths, respectively. An insulation layer within the source trench insulates the multiple source electrodes from each other and from the drift region. Each source electrode within a source trench is connected to the source contact.

According to another embodiment of the invention, an example power semiconductor device has a semiconductor body with a plurality of alternating gate-source trenches and a plurality of source contact trenches formed therein. A source contact metal along the top surface of the device contacts the source and channel regions through the source contact trenches, as similarly described above.

The gate-source trenches extend from the surface of the semiconductor body through the source and channel regions and into the drift region, for example. A conductive insulated gate electrode is disposed within the upper portion of each trench adjacent to the channel region. In addition, a conductive insulated source electrode is disposed adjacent to the drift region and below the gate electrode. Each gate electrode is connected to a gate contact and each source electrode is connected to the source contact.

An insulation layer lines each trench and has a non-uniform thickness, being thinner along the side-wall between the gate electrode and channel region and thicker along the side-wall between the drift region and the source electrode. The insulation layer also insulates the source and gate electrodes from one another.

According to a variation of the above embodiment of the invention, an example semiconductor device includes a plurality of source contact trenches and a plurality of gate-source trenches with gate and source electrodes disposed therein, as similarly described above. Here, however, the source electrode with each trench extends from the surface of the device vertically down a center of the trench to within the drift region, for example, towards the trench bottom. In addition, the gate electrode with each trench is now split into two electrodes, for example, each gate electrode being the same length and extending down opposing sides of the trench adjacent to the source electrode and to the channel region. However, the gate electrodes extend to a shallower depth than the source electrode. Again, an insulation layer of non-uniform thickness lines the side-wall and bottom of each trench and insulates the electrodes from one another.

According to a sixth embodiment of the invention, an example power semiconductor device has a semiconductor body with a plurality of gate trenches formed therein. Each gate trench extends from the surface of the semiconductor body through the source and channel regions and into the drift region, for example. Each gate trench is lined with an insulation layer. A gate electrode is disposed within each gate trench, however, the gate electrode does not extend to the bottom of the trench. Accordingly, a gate insulation plug is disposed beneath the bottom of each gate electrode, thereby filling the gap.

According to a variation of the above embodiment of the invention, every other gate trench does not include a gate electrode but rather, the gate insulation plug fills the entire trench. According to another variation of the above embodiment of the invention, an implant of a second conductivity type is formed within the drift region along the side-wall of each gate trench that is entirely filled with a gate insulation plug.

Other features and advantages of the present invention will become apparent from the following description of the invention, which refers to the accompanying drawings.

BRIEF DESCRIPTION OF THE DRAWINGS

FIG. 2A shows a cross-sectional view of an example power semiconductor device according to an embodiment of the invention, the device including source trenches and source electrodes that extend to greater depths than gate trenches and gate electrodes.

FIG. 2B shows an alternate embodiment of the example device shown in FIG. 2A, the example device including source trench side-walls that slope inward along the drift region.

FIGS. 2C and 2D show alternate embodiments of the example device shown in FIG. 2A, the example devices including an insulation layer along the side-wall of the source trenches that increases in thickness along the drift region.

FIG. 3A shows a cross-sectional view of an example trench type power semiconductor device according to an embodiment of the invention, the device including source and gate trenches that extend to a similar depth and source electrodes that extend to a greater depth than gate electrodes.

FIG. 3B shows an alternate embodiment of the example device shown in FIG. 3A, the example device including an insulation layer along the side-wall of the source trenches that increases in thickness along the drift region.

FIG. 3E shows an alternate embodiment of the example device shown in FIG. 3A, the example device having source and channel regions that are etched-back along the source trenches.

FIGS. 3F-3I show alternate embodiments of the example device shown in FIG. 3A, the example devices having semiconductor bodies with different doping concentrations and source and gate trenches of varying depths within the semiconductor bodies.

FIGS. 3J and 3K show alternate embodiments of the example device shown in FIG. 3A, the side-wall of the source and gate trenches of the example devices sloping inward along the drift region.

FIGS. 3L and 3M show alternate embodiments of the example device shown in FIG. 3A, the example devices having an insulation layer along the side-wall of the source trenches that increases in thickness along the drift region.

FIG. 3N shows an alternate embodiment of the example device shown in FIG. 3A, the example device including multiple source electrodes in each source trench.

FIGS. 3O and 3P show an alternate embodiment of the example device shown in FIG. 3A, the example device also including a plurality of integrated Schottky contacts.

FIG. 3R shows an alternate embodiment of the example device shown in FIG. 3A, the example device including proud source and gate electrodes.

FIG. 4A shows a cross-sectional view of an example trench type power semiconductor device according to an embodiment of the invention, the device including source and gate trenches that extend to a similar depth and source and gate electrodes that extend to a similar depth.

FIG. 4B shows an alternate embodiment of the example device shown in FIG. 4A, the example device having source and channel regions that are etched-back along the source trenches.

FIGS. 4C-4F show alternate embodiments of the example device shown in FIG. 4A, the example devices having semiconductor bodies with different doping concentrations and source and gate trenches of varying depths within the semiconductor bodies.

FIGS. 4G and 4H show alternate embodiments of the example device shown in FIG. 4A, the side-wall of the source and gate trenches of the example devices sloping inward along the drift region.

FIGS. 4I and 4J show an alternate embodiment of the example device shown in FIG. 4A, the example device also including a plurality of integrated Schottky contacts.

FIG. 4L shows an alternate embodiment of the example device shown in FIG. 4A, the example device including proud source and gate electrodes.

FIG. 5 shows a cross-sectional view of an example power semiconductor device according to another embodiment of the invention, the device including source trenches with source electrodes formed from the source contact metal.

FIG. 6A shows a cross-sectional view of an example power semiconductor device according to another embodiment of the invention, the device including gate trenches each having a varying width gate electrode.

FIG. 6B shows alternate embodiment of the example device shown in FIG. 6A, the example device having multiple gate electrodes in each gate trench.

FIG. 6C shows a cross-sectional view of an example power semiconductor device according to another embodiment of the invention, the device including source and gate trenches and source and gate electrodes that extend to similar depths, the source and gate electrodes in each trench having varying widths.

FIG. 6D shows alternate embodiment of the example device shown in FIG. 6B, the example device now having source electrodes that are thin and of uniform width.

DETAILED DESCRIPTION OF THE PREFERRED EMBODIMENTS

Figure 1A:
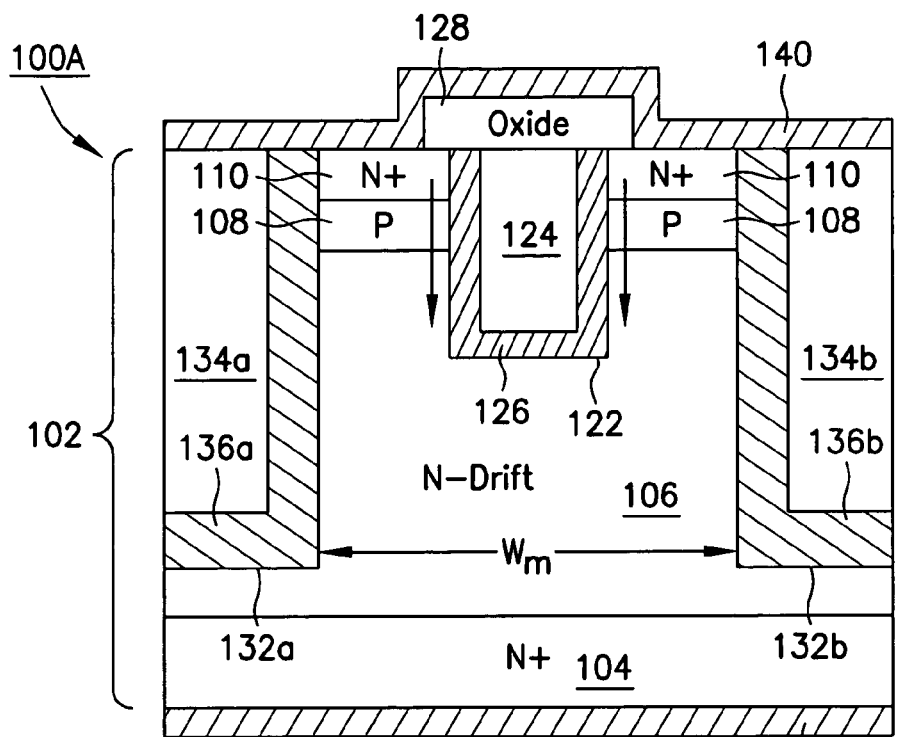
FIGS. 1A-1C show cross-sectional views of a trench type power semiconductor devices according to the prior art.
Figure 1B:
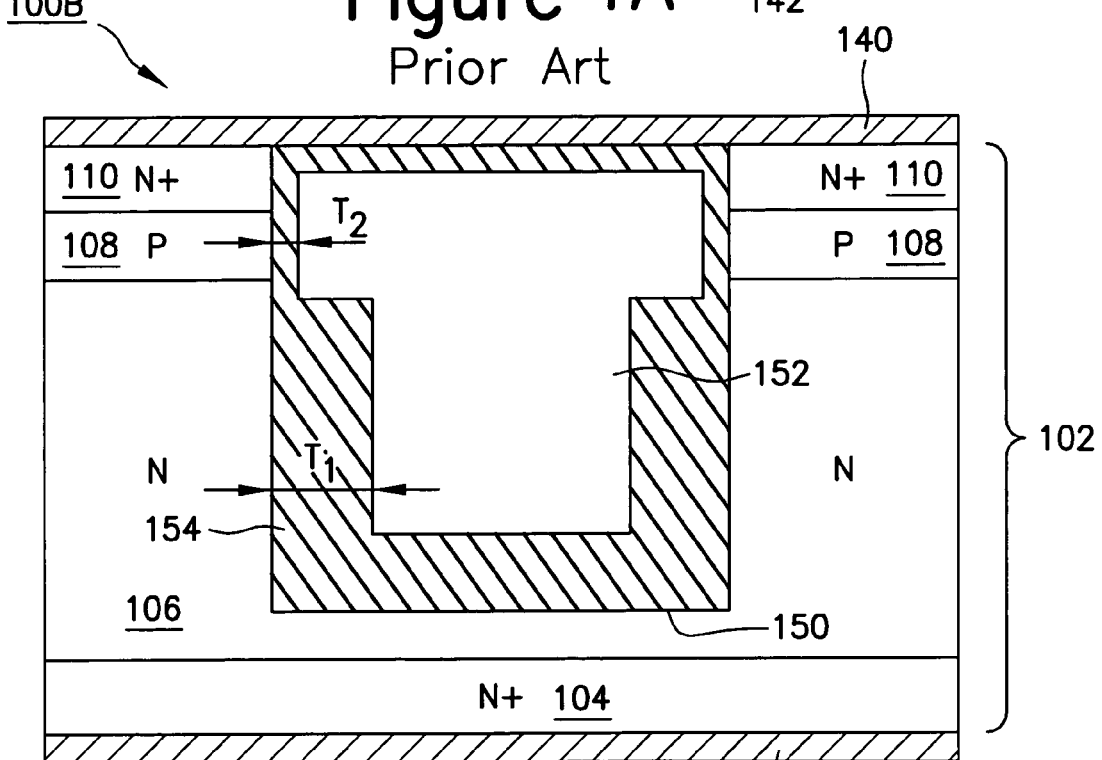
Figure 1C:
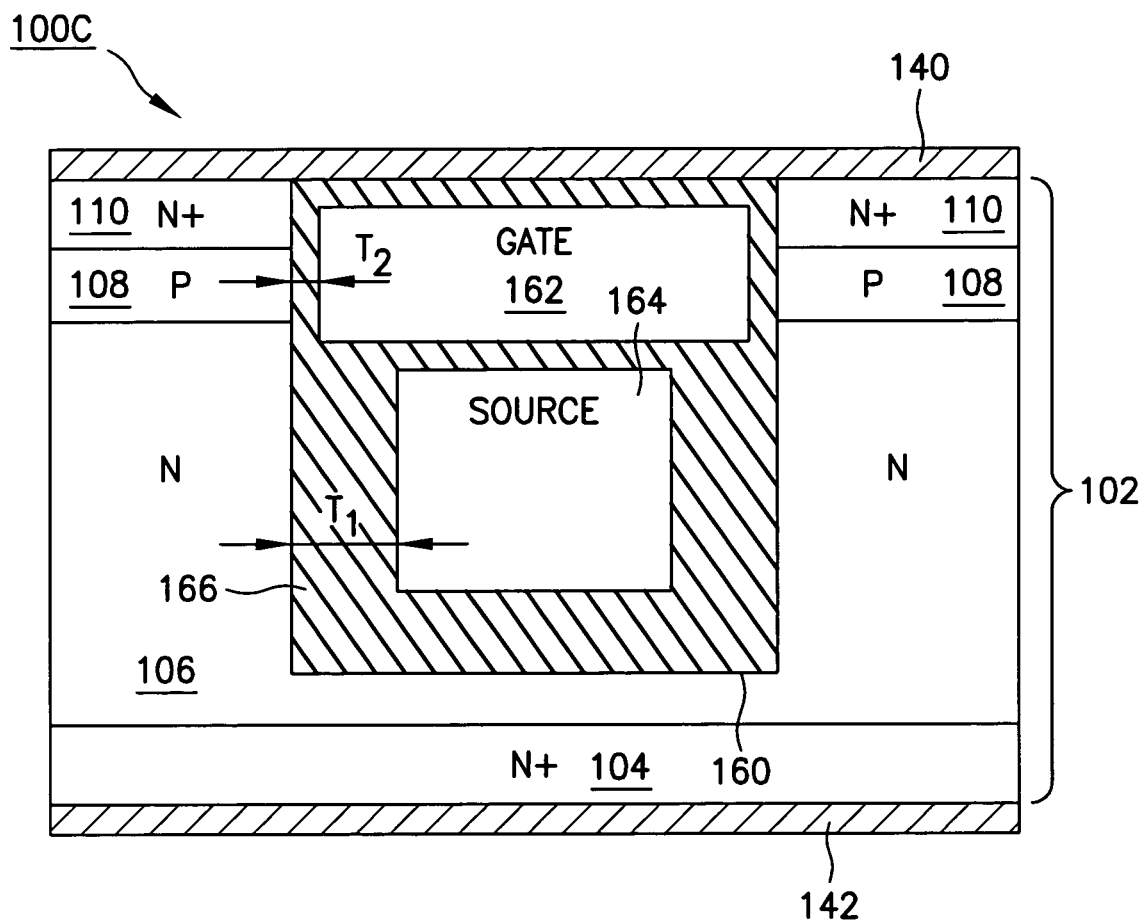

Referring to FIG. 2A, there is shown in cross section a portion of an example power semiconductor device 200A according to an embodiment of the present invention (Note that FIG. 2A and the other Figures described below are not drawn to scale). Device 200A includes a semiconductor body 202 that has a highly doped drain region 204 of a first conductivity type (e.g., N-type) and a drift region 206 of the same conductivity type, but of lower concentration of impurities, formed thereon. Formed over drift region 206 is channel region 208. Channel region 208 is of a second conductivity type opposite to that of the first conductivity type (e.g. P-type). Formed along the surface of semiconductor body 202 and over channel region 208 is a highly doped source region 210 of the first conductivity type (e.g. N-type).

According to an embodiment of the invention, drift region 206 is uniformly doped throughout. According to another embodiment of the invention, the doping in drift region 206 increases monotonically from channel region 208 towards drain region 204. The lower doping of the drift region along the junction of the channel region improves the breakdown voltage of device 200A, by inhibiting the occurrence of reach-through breakdown, while the increased doping the drift region towards the junction of the drain region reduces the on-resistance of the device.

Semiconductor device 200A further includes a plurality of trench-based gate electrodes, such as trench-based gate electrode 220, and a plurality of trench-based source electrodes, such as trench-based source electrodes 230a and 230b, with the trench-based gate electrodes and trench-based source electrodes being arranged in an interleaved/alternating pattern. Preferably, the trench-based gate electrodes and trench-based source electrodes of device 200A are formed in a cellular design (e.g., hexagonal or rectangular), although a strip design can also be used. Notably, the cellular design increases the charge coupling between source region 210 and drift region 206, thereby reducing the on-resistance.

Trench-based gate electrode 220 includes gate trench 222 and conductive insulated gate electrode 224. Gate trench 222 extends from the top surface of semiconductor body 202, through source region 210 and channel region 208, and into drift region 206, for example. Gate electrode 224 is disposed within gate trench 222 and is composed of, for example, conductive polysilicon. Gate electrode 224 may be recessed below the top surface of semiconductor body 202 and extends above and below the top and bottom surfaces of channel region 208.

A gate insulation layer 226 lines the side-wall and bottom of gate trench 220, thereby insulating gate electrode 224 from the source region, channel region, and drift region. Gate insulation layer 226 may be formed with silicon dioxide, for example. Preferably, gate insulation layer 226 is thicker along the bottom of gate trench 220 than along the side-wall of the trench, thereby helping to improve the breakdown voltage of the device. Covering the top of gate electrode 224 and filling the remainder of gate trench 220, for example, is gate insulation cap 228, which insulates the gate electrode from source contact 240. As shown, gate insulation cap 228 may extend above the top surface of semiconductor body 202 and laterally covers a portion of the top surface of source region 210.

Trench-based source electrodes 230a and 230b include source trenches 232a and 232b and conductive insulated source electrodes 236a and 236b, respectively. Source trenches 230a/230b extend from the top surface of semiconductor body 202 through source region 210 and channel region 208, and into drift region 206 to a depth below the bottom of gate trench 222. Source electrodes 234a/234b are disposed within source trenches 232a/232b and are composed of, for example, conductive polysilicon. As shown in FIG. 2A, the source electrodes may be recessed below the top surface of semiconductor body 202 and in particular, below the top surface of channel region 208. According to this embodiment of the invention, the source electrodes extend towards the bottom of the source trenches along the drift region to a depth beyond the bottom of gate electrode 224.

Source insulation layers 236a and 236b, which may be formed from silicon dioxide for example, line a portion of the side-wall and bottom of source trenches 232a/232b, thereby insulating the electrodes from drift region 206. However, according to this embodiment of the invention, source insulation layers 236a/236b do not line the trench side-wall along the etched source region 210 and a portion of the etched channel region 208.

Semiconductor device 200A further includes drain contact 242 along the bottom surface of semiconductor body 202 and source contact 240 along the top surface of semiconductor body 202. Drain contact 240 is in electrical contact with drain region 204. Source contact 240 fills the upper portion of source trenches 232a/232b and extends over gate insulation cap 228 and the exposed top surface source region 210. Accordingly, source contact 240 contacts the upper surface of source electrodes 234a/234b, contacts channel region 208 and source region 210 along their etched surfaces that form the side-wall of the source trenches, and contacts source region 210 along the exposed top surface thereof, thereby electrically connecting/shorting the source electrodes, channel region, and source region. As indicated above, gate insulation cap 228 insulates gate electrode 224 from the source contact.

Notably, trench-based source electrodes 230a and 230b provide an improved breakdown voltage for device 200A by pushing the depletion region further into the drift region when the device is in the off-state. In addition, by having source contact 240 contact channel region 208 along the etched side-wall of the source trenches, the cell pitch of device 200A is reduced. For example, device 200A may have a cell pitch between 1.4-2.0 um.

In general, fabrication steps known in the art may be used to form device 200A. In particular, it should be noted that because the source trenches 232a/232b and gate trenches 222 have different depths, the trenches must be etched during different steps, thereby requiring intermediate masking steps.

Referring now to FIG. 2B, there is shown example semiconductor device 200B according to an embodiment of the invention. Device 200B is similar to device 200A. Rather than the side-wall of source trenches 232a/232b being substantially vertical, however, the side-wall of the trenches now slope inward substantially along the drift region 206. In particular, as shown in FIG. 2B, source trenches 232a/232b may be vertical along source region 210 and a portion of channel region 208, for example, and may thereafter slope inward substantially along drift region 206. This slope causes drift region 206 to increase in area between the source trenches as the drift region descends away from channel region 208 towards drain region 204. As a result, the charge within the drift region increases as the drift region descends away from the channel region, this increased charge improving the on-resistance of the device. According to this embodiment of the invention and as shown in FIG. 2B, source insulation layers 236a/236b and source electrodes 234a/234b also slope inward with the side-wall of the trenches, the source electrodes thereby decreasing in width as the electrodes extend within the trenches along the drift region.

Referring now to FIG. 2C, there is shown example semiconductor device 200C according to an embodiment of the invention. Device 200C is similar to device 200A. Rather than source insulation layers 236a/236b having essentially uniform thickness along the side-wall of source trenches 232a/232b, however, the source insulation layers now vary/increase in thickness, particularly along a substantial portion of the drift region. Specifically, as shown in FIG. 2C, the side-wall thickness of source insulation layers 236a/236b slope inward as the insulation layers descend along the drift region away from channel region 208, thereby increasing in thickness. As a result, source electrodes 234a/234b also slope inward and away from the side-wall of the trenches as the electrodes descend away from channel region 208, the electrodes thereby decreasing in width. Notably, by varying/increasing the insulation layer thickness, the coupling between the source electrodes and drift region 206 is reduced.

Referring now to FIG. 2D, there is shown example semiconductor device 200D according to an embodiment of the invention. Device 200D is similar to device 200C in that source insulation layers 236a/236b have varying/increasing thickness substantially along drift region 206 to help reduce the coupling between source electrodes 234a/234b and the drift region. Specifically, according to this embodiment of the invention and as shown in FIG. 2D, source insulation layers 236a/236b now increase in thickness in a step-wise fashion as the insulation layers descend away from channel region 208 and descend along the drift region. Note that FIG. 2D shows two different thicknesses for the source insulation layers 236a/236b. Nonetheless, the number of different thicknesses may be increased. By stepping inward the thickness of the side-wall source insulation layers, source electrodes 234a/234b also step inward and away from the sides of the trenches as the electrodes descend along the drift region towards the bottom of the trenches. As a result, the source electrodes decrease in width in a step-wise fashion. Accordingly, the coupling between the source electrodes and drift region is reduced.

In general note that drift region 206 for each of the example embodiments shown in FIGS. 2B-2D may be uniformly doped or may be doped in a monotonically increasing fashion, as similarly described above for device 200A.

Referring now to FIG. 3A, there is shown example semiconductor device 300A according to an embodiment of the invention. Device 300A includes a semiconductor body 302 that is similar to semiconductor body 202. In particular, semiconductor body 302 includes a highly doped drain region 304, a drift region 306, and a highly doped source region 310, each of a first conductivity type, and a channel region 308 of a second conductivity type opposite to that of the first conductivity type. According to this embodiment of the invention, drift region 306 is uniformly doped and has a lower concentration of impurities than drain region 304.

Semiconductor device 300A further includes a plurality of trench-based gate electrodes, such as trench-based gate electrode 320, interleaved in an alternating fashion with a plurality of trench-based source electrodes, such as trench-based source electrodes 330a and 330b. Preferably, the trench-based gate electrodes and trench-based source electrodes are formed in a cellular design (e.g., hexagonal or rectangular), although a strip design can also be used.

Trench-based source electrodes 330a/330b are similar to trench-based source electrodes 230a/230b as described for device 200A, for example. In particular, the trench-based source electrodes include source trenches 332a and 332b that extend into drift region 306 to a depth below the bottom of channel region 308. Within source trenches 332a/332b are conductive insulated source electrodes 336a and 336b, respectively. The source electrodes may be recessed below the top surface of semiconductor body 302 and in particular, below the top surface of channel region 308. As shown in FIG. 3A, the source electrodes extend beyond the bottom of the channel region and along the drift region towards the bottom of the source trenches and in particular, may extend to an approximate depth of 1.3 um for example, below the top surface of the semiconductor body. Source insulation layers 336a/336b line a portion of the side-wall and bottom of source trenches 332a/332b, leaving exposed the trench side-wall along the etched source region 310 and a portion of the etched channel region 308.

Trench-based gate electrode 320 includes gate trench 322 and conductive insulated gate electrode 324. According to this embodiment of the invention, gate trench 322 extends from the top surface of semiconductor body 302, through source region 310 and channel region 308, and into drift region 306 to substantially the same depth as source trenches 332a/332b. Gate electrode 324 is disposed within gate trench 322. The electrode may be recessed below the top surface of semiconductor body 302 and extends above and below the top and bottom surfaces of channel region 308. According to this embodiment of the invention, the gate electrode does not extend to the bottom of gate trench 322 and does not extend to the same depth as source electrodes 336a/336b. For example, as shown in FIG. 3A, the gate electrode may extend to a depth of 0.5 um below the top surface of semiconductor body 202 and may be approximately 0.8 um shallower than source electrodes 334a/334b.

A gate insulation layer 326 lines the side-wall and bottom of gate trench 320, thereby insulating the gate electrode from the source region, channel region, and drift region. Preferably, the side-wall thickness of source insulation layers 336a/336b, especially towards the bottom of the source trenches, is thicker than the side-wall thickness of gate insulation layer 326. According to this embodiment of the invention, a gate insulation plug 327 fills the void/gap below the bottom of the gate electrode. Covering the top of the gate electrode and filling the remainder of gate trench 322 is gate insulation cap 328, which insulates the gate electrode from source contact 340. This cap may extend above the top surface of semiconductor body 302 and laterally covers a portion of the top surface of source region 310.

Semiconductor device 300A further includes drain contact 342, which is in electrical contact with drain region 304, and source contact 340 along the top surface of semiconductor body 302. Source contact 340 fills the upper portion of source trenches 332a/332b and electrically contacts source electrodes 334a/334b, channel region 308, and source region 310, as similarly described for device 200A.

In general, fabrication steps known in the art may be used to form device 300A. In particular, it should be noted that because source trenches 332a/332b and gate trench 322 are the same depth, the trenches can be etched at the same time, thereby requiring fewer mask steps and simplifying the fabrication of device 300A in this aspect. In addition, source insulation layers 336a/336b and gate insulation layer 326 may be formed at the same time. Furthermore, the polysilicon that forms source electrodes 334a/334b and gate electrodes 324 can be filled in the source trenches and gate trenches at the same time.

Referring now to FIG. 3B, there is shown example semiconductor device 300B according to an embodiment of the invention. Device 300B is similar to device 300A and has a structure similar to that of device 200D described above. In particular, rather than source insulation layers 336a/336b having essentially uniform thickness along the side-wall of source trenches 332a/332b along the drift region, the source insulation layers now increase in thickness in a step-wise fashion as the insulation layers descend along the drift region towards the bottom of the trenches. As shown in FIG. 3B, source insulation layers 336a/336b may have a non-varying thickness along the trench side-walls to an approximate depth to that of the bottom of gate electrode 324, for example, and thereafter increase in thickness in a step-wise fashion. Note that FIG. 3B shows two different thicknesses for the source insulation layers 336a/336b. Nonetheless, the number of varying thicknesses may be greater than two. As similarly described for device 200D, by stepping inward the thickness of the side-wall insulation layers, source electrodes 334a/334b also step inward and away from the trench side-walls as the electrodes descend along the drift region towards the bottom of the trenches, the electrodes thereby decreasing in width. As a result, the coupling between the source electrodes and drift region 306 is reduced.

Figures 3C, 3D:
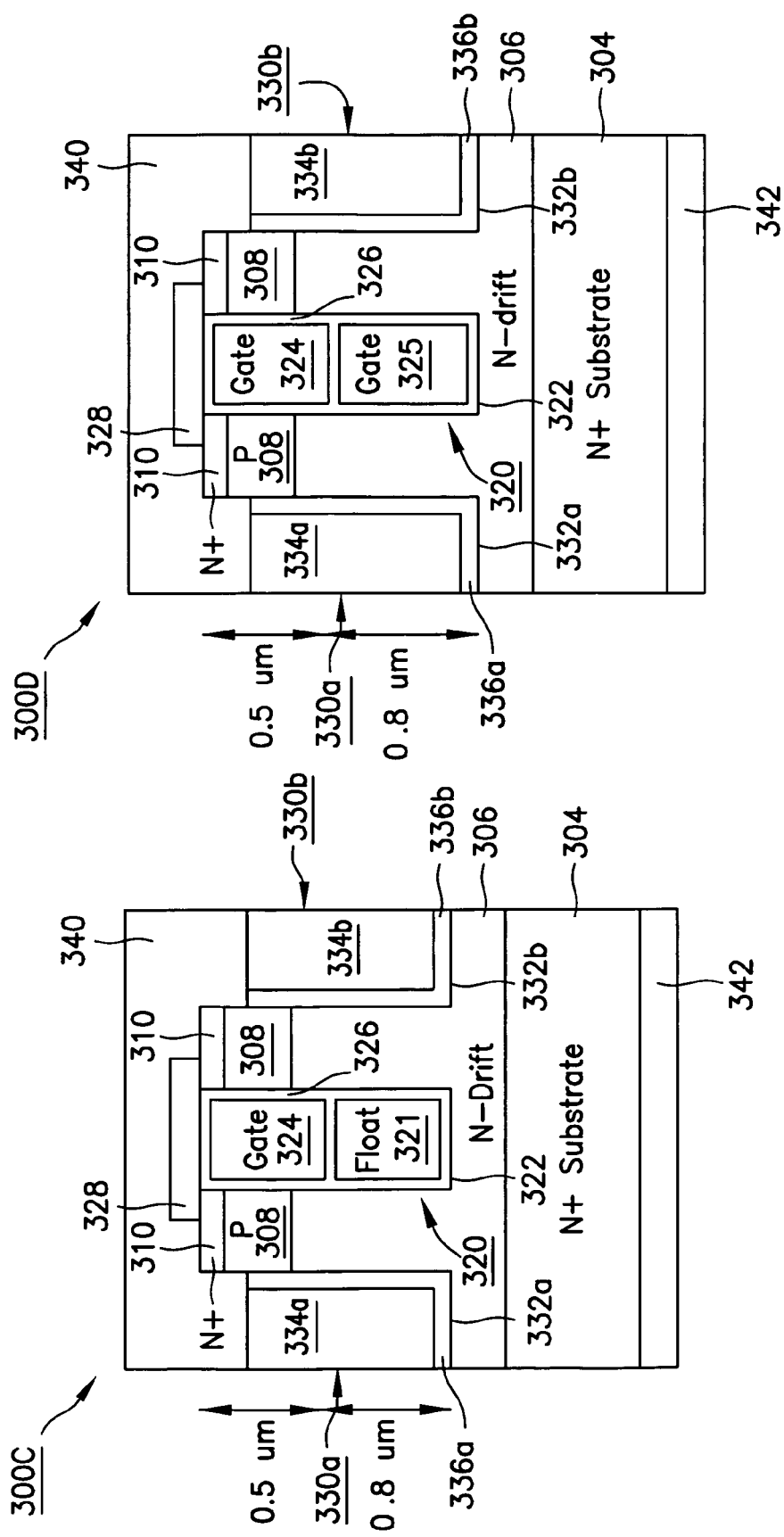
FIGS. 3C and 3D show alternate embodiments of the example device shown in FIG. 3A, the example devices including multiple gate electrodes in each gate trench.

Referring now to FIG. 3C, there is shown example semiconductor device 300C according to an embodiment of the invention. Device 300C is similar to device 300A and in particular, includes a gate trench 322 that extends to the same depth as source trenches 332a/332b and includes a gate insulation layer 326 that lines the side-wall and bottom of the gate trench. However, according to this embodiment of the invention, gate trench 322 does not include gate insulation plug 327 but rather, includes a floating gate electrode 321 disposed below conductive insulated gate electrode 324. Floating gate electrode 321 may be composed of, for example, conductive polysilicon and extends towards the bottom of the gate trench to the same depth, for example, as source electrodes 334a/334b. As shown, gate insulation layer 326 extends between the gate electrodes 324 and 321, thereby isolating the two gate electrodes from each other. According to this embodiment of the invention, gate electrode 324 is connected to the gate contact (not shown in the Figure) of the device. However, floating gate electrode 321 floats, and is not connected to the gate contact.

Referring now to FIG. 3D, there is shown example semiconductor device 300D according to an embodiment of the invention. Device 300D is similar to device 300C and includes within gate trench 322 a first gate electrode 324 and a second gate electrode 325 disposed below gate electrode 324. Gate electrodes 324 and 325 are as similarly described above. However, rather than having the second gate electrode float, gate electrode 325 is connected to the gate contact of the device. Note that insulation layer 326 continues to extend between the two gate electrodes, thereby isolating the gate electrodes within trench 322.

Referring now to FIG. 3E, there is shown example semiconductor device 300E according to an embodiment of the invention. Device 300E is similar to device 300A, but now includes an etched back source region 310 and an etched back drift region 308. Specifically, according to this embodiment of the invention, source trenches 332a/332b extend into drift region 306 to a depth below the bottom of channel region 308 and may extend, for example, to a depth between 1.0-2.1 um below the top surface of semiconductor body 302. As illustrated in FIG. 3E, a portion (as indicated by arrows 333a and 333b) of source region 310 and channel region 308 are now etched back from the side-wall of source trenches 332a/332b. Conductive source electrodes 336a/336b may be recessed below the top surface of the semiconductor body and in particular, may be recessed to a depth that is approximately level with the top etched surface of channel region 308. As shown in FIG. 3D, the source electrodes extend along the drift region and may extend to a depth between 0.9-1.8 um, for example, below the top surface of the semiconductor body and may extend to within 0.1-0.3 um, for example, of the bottom of the source trenches. Source insulation layers 336a/336b continue to line the side-wall and bottom of the source trenches, insulating the source electrodes from drift region 306.

Gate trench 322 and gate electrode 324 are as similarly described above for device 300A. In particular, according to this embodiment of the invention, the gate electrode may extend to a depth of 0.4-0.8 um, for example, below the top surface of semiconductor body 302 and may be 0.5-1.0 um, for example, shallower than source electrodes 334a/334b. Gate insulation layer 326 continues to line the side-wall and bottom of gate trench 320. Gate insulation plug 327 fills the void/gap below the bottom of the gate electrode and gate insulation cap 328 covers the top of the gate electrode, filling the remainder of the gate trench. Gate insulation cap 328 may continue to extend above the top surface of semiconductor body 302 and in particular, may now laterally cover essentially the entire top surface of source region 310.

Drain contact 342 is in electrical contact with drain region 304. Source contact 340 covers the top surface of semiconductor body 302 and fills the upper portion of source trenches 332a/332b and now also fills the etched back areas 333a and 333b of the source region and channel region. Accordingly, source contact 340 now electrically contacts the etched-back side surface of source region 310 and the etched-back side and top surfaces of channel region 308, thereby electrically connecting the source electrodes, channel region, and source region.

Note that the use of etched source and channel regions as described for device 300E are also applicable to the embodiments of the invention shown in FIGS. 3C and 3D.

Referring now to FIG. 3F, there is shown example semiconductor device 300F according to an embodiment of the invention. Device 300F is similar to device 300E. According to this embodiment of the invention, however, source trenches 332a/332b and gate trench 322 now extend through drift region 306 and into drain region 304 such that there is no drift region under the bottom of the trenches. In order for the source trenches and gate trench to extend into drain region 304, the depth of drift region 306 may be varied (while also possibly varying the depth of drain region 304, for example) or the depth of the source trenches 332a/332b and gate trench 322 may be varied. Alternatively, both the depth of the drift/drain region and the depth of the trenches may be varied.

Note that the extension of the source and gate trenches into the drain region is also applicable to the embodiments of the invention shown in FIGS. 3A-3D.

Referring now to FIG. 3G, there is shown example semiconductor device 300G according to an embodiment of the invention. Device 300G is similar to device 300E. Here, however, a buffer region 307 of the same conductivity (i.e., the first conductivity type) as drain region 304 and drift region 306 (e.g., N-type) is epitaxially grown between the drain region and drift region. Buffer region 307 has a lower concentration of impurities than drain region 304 and a higher concentration of impurities than drift region 306. By adding buffer region 307, the avalanche performance of the device is improved, thereby improving the breakdown voltage. Note that buffer region 307 does not significantly increase the on-resistance of the device.

According to this embodiment of the invention, source trenches 332a/332b and gate trench 322 extend into drift region 306 but not into buffer region 307. Accordingly, a portion of drift region 306 remains below the bottom of the trenches. A specific distance between the bottom of the trenches and the top of the buffer region is not required and may be varied for design purposes.

Note that the addition of a buffer region 307 is also applicable to the embodiments of the invention shown in FIGS. 3A-3D.

Referring now to FIG. 3H, there is shown example semiconductor device 300H according to an embodiment of the invention. Device 300H is similar to device 300G, however here, source trenches 332a/332b and gate trench 322 now extend through drift region 306 and into buffer region 307 such that there is no drift region under the bottom of the trenches. In order for the source trenches 332a/332b and gate trench 322 to extend into buffer region 307, the depth of drift region 306 may be varied (while also possibly varying the depth of buffer region 307, for example) or the depth of the source trenches and gate trench may be varied. Alternatively, both the depth of the drift/buffer region and the depth of the trenches may be varied.

Note that the addition of a buffer region 307 and the extension of the source and gate trenches into this region is also applicable to the embodiments of the invention shown in FIGS. 3A-3D.

Figures 3I, 3J:
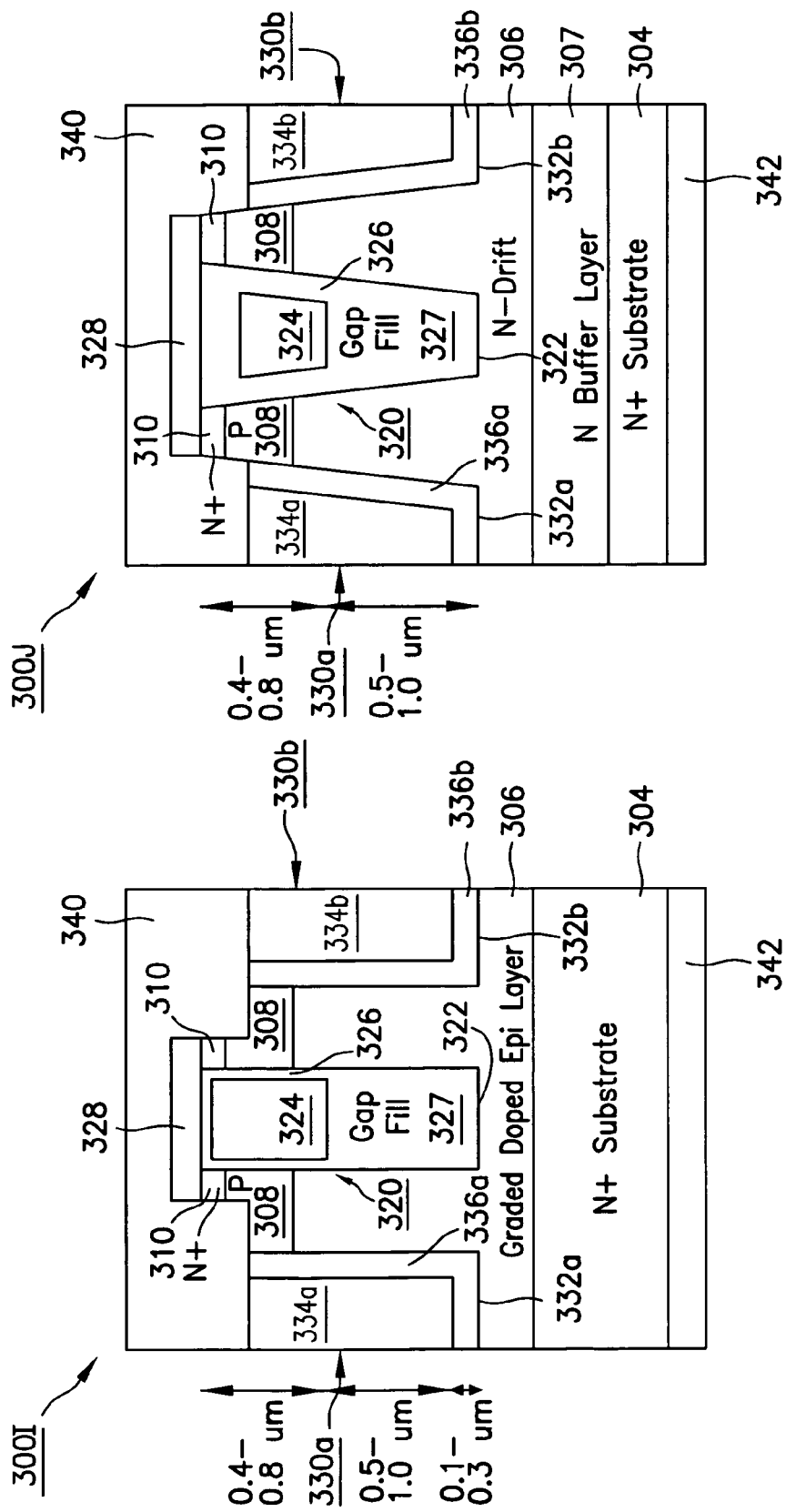

Referring now to FIG. 3I, there is shown example semiconductor device 300I according to an embodiment of the invention. Device 300I is similar to device 300E. According to this embodiment of the invention, however, drift region 306 is not uniformly doped. Rather, the doping increases monotonically from channel region 308 to drain region 304, which, as described above, improves the breakdown voltage and the on-resistance of the device. Here, source trenches 332a/332b and gate trench 322 extend within semiconductor body 302 to a depth that does not exceed the drift region.

Note that the use of a non-uniformly doped drift region is also applicable to the embodiments of the invention shown in FIGS. 3A-3D.

Referring now to FIG. 3J, there is shown example semiconductor device 300J according to an embodiment of the invention. Device 300J is similar to device 300G, however, unlike the vertical trench side-wall of device 300G, the side-wall of source trenches 332a/332b and gate trench 322 now slope inward, particularly through the drift region. Specifically, as shown in FIG. 3J, the side-wall of source trenches 332a/332b and gate trench 322 extend from the surface of semiconductor body 302 and slope inward through source region 310, channel region 308, and into drift region 306 towards the bottom of the trenches (note that the source and channel regions are not etched backed). As a result, drift region 306 increases in area between gate trench 322 and the adjacent source trenches 332a/332b as the drift region descends away from channel region 308. As similarly described above for device 200B, the increased area of the drift region causes the charge within the drift region to increase as the drift region descends away from the channel region, this increased charge improving the on-resistance of the device.

According to this embodiment of the invention, source insulation layers 336a/336b, gate insulation layer 326, gate insulation plug 327, and the source and gate electrodes 334a/334b/324 also slope inward with the side-wall of the trenches, the source and gate electrodes thereby decreasing in width along the length thereof.

Note that semiconductor body 302 and the source/gate trench depths of device 300J are not restricted to the form shown in FIG. 3J and the semiconductor body and trench depths of the device may also resemble the embodiments shown in FIGS. 3E, 3F, 3H, and 3I, for example.

Referring now to FIG. 3K, there is shown example semiconductor device 300K according to an embodiment of the invention. Device 300K is similar to device 300J in that the side-wall of source trenches 332a/332b and gate trench 322 slope inward substantially along drift region 306, thereby increasing the area of the drift region between the source and gate trenches and resulting in increased charge along the drift region. However, according to this embodiment of the invention, the side-wall of the source trenches 332a/332b and gate trench 322 now extend at a substantially vertical angle from the surface of semiconductor body 302 through source region 310 and channel region 308, and possibly into drift region 306, for example. Thereafter, the side-wall of the trenches slope inward substantially along the drift region towards the bottom of the trenches, thereby increasing the area of the drift region. Notably, having the side-wall of the trenches descend vertically through the channel region 308 rather than at a sloped angle, as in device 300J, ensures that the channel region is as short as possible while also allowing for improved on-resistance due to an enlarged drift area.

According to this embodiment of the invention, source trenches 332a/332b and gate trench 322 may have a depth of approximately 1.6 um, for example, from the top surface of the semiconductor body. In addition, the gate trench and gate electrode 324 may be formed such that the gate electrode extends only through the vertical portion of the gate trench (thereby having vertical walls) and may extend to a depth, for example, of 0.8 um below the top surface of the semiconductor body. The source trenches 332a/332b and source electrodes 334a/334b may be formed such that the side-wall of the source electrodes are substantially vertical through the depth of the gate electrode and thereafter slope inward following the contour of the sloped trench.

According to an example fabrication process for device 300K, the source and gate trenches are formed in two steps. During the first step, the top portion of each trench is formed using a chemical etching process, thereby yielding an approximate 90° side-wall angle. During the second step, the bottom portion of each trench is formed using an etch recipe, thereby yielding the sloped sidewall.

Note that semiconductor body 302 and the source/gate trench depths of device 300K are not restricted to the form shown in FIG. 3K and the semiconductor body and trench depths of the device may also resemble the embodiments shown in FIGS. 3A, 3E, 3F, 3H, and 3I, for example.

Referring now to FIG. 3L, there is shown semiconductor device 300L according to an embodiment of the invention. Device 300L is similar to device 300G and has a structure somewhat similar to that of device 200C described above. In particular, rather than source insulation layers 336a/336b having essentially uniform thickness along the side-wall of source trenches 332a/332b along the drift region, the source insulation layers now increase in thickness in a slope-wise fashion along the drift region towards the bottom of the trenches. As a result, the source electrodes 334a/334b also slope inward and away from the trench side-walls substantially along the drift region, thereby decreasing in width. As described above for device 200C, by having the source electrodes 334a/334b slope away from the trench side-walls with the increasing insulation layer thickness, the coupling between the source electrodes and drift region 306 is reduced.

In particular, as shown in FIG. 3L, source insulation layers 336a/336b may have essentially uniform thickness along the trench side-walls to an approximate depth to that of the bottom of gate electrode 324, for example. Thereafter the source insulation layers increase in thickness substantially along the drift region towards the bottom of the trenches. As result, the side-wall of the source electrodes 334a/334b may be substantially vertical through the depth of the gate electrode, for example, and thereafter slope inward towards the bottom of the trenches and away from the side-walls of the trenches.

Note that semiconductor body 302 and the source/gate trench depths of device 300L are not restricted to the form shown in FIG. 3L and the semiconductor body and trench depths of the device may also resemble the embodiments shown in FIGS. 3A, 3E, 3F, 3H, and 3I, for example.

Figures 3M, 3N:
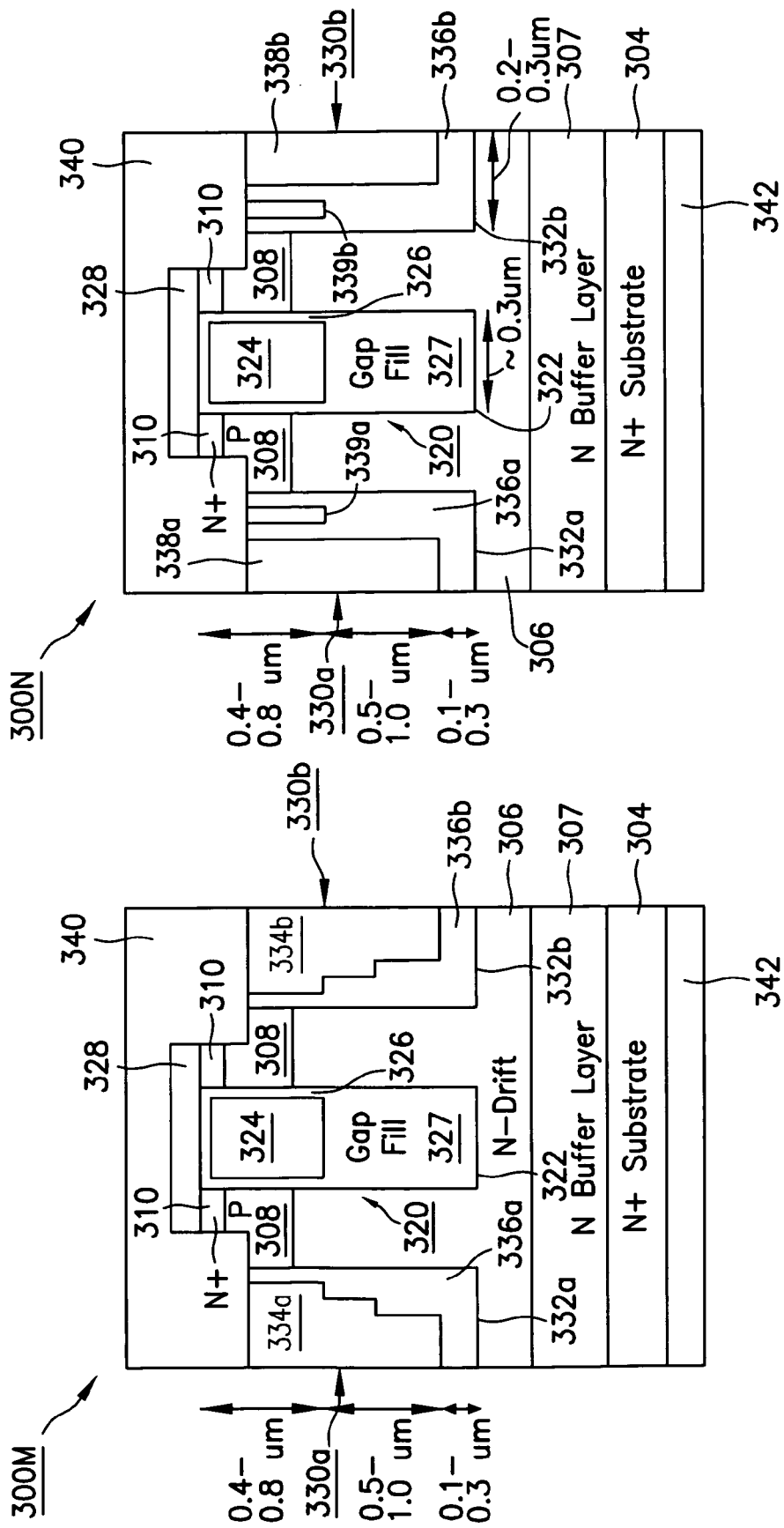

Referring now to FIG. 3M, there is shown semiconductor device 300M according to an embodiment of the invention. Device 300M is similar to device 300L (and has a structure somewhat similar to devices 200D and 300B) in that source insulation layers 336a/336b have varying/increasing thickness substantially along the drift region to help reduce the coupling between source electrodes 334a/334b and drift region 306. Specifically, according to this embodiment of the invention and as shown in FIG. 3M, source insulation layers 336a/336b may have essentially uniform thickness along the side-wall of the source trenches to an approximate depth to that of the bottom of gate electrode 324, for example. Thereafter, the source insulation layers may increase in thickness in a step-wise fashion along the drift region towards the bottom of the trenches. As result, the side-wall of the source electrodes 334a/334b may be substantially vertical through the depth of the gate electrode, for example, and thereafter step inward and away from the side-wall of the trenches along the drift region. Note that FIG. 3J shows three different thicknesses for the source insulation layers 336a/336b. Nonetheless, the number of varying thicknesses may be fewer than or greater than three.

Note that semiconductor body 302 and the source/gate trench depths of device 300M are not restricted to the form shown in FIG. 3M and the semiconductor body and trench depths of the device may also resemble the embodiments shown in FIGS. 3E, 3F, 3H, and 3I, for example.

Referring now to FIG. 3N, there is shown example semiconductor device 300N according to an embodiment of the invention. Device 300N is similar to device 300G. According to this embodiment of the invention, however, each trench-based source electrode 330a/330b now includes multiple source electrodes of different lengths, including source electrodes 338a/338b and source electrodes 339a/339b, each disposed within the source trenches 332a/332b.

Specifically, according to this embodiment of the invention, source trenches 332a/332b may extend between 1.0-2.1 um, for example, below the top surface of semiconductor body 302 and may have a half width between 0.2 to 0.3 um, for example. Extending down the center of the source trenches and through the drift region are source electrodes 338a/338b and extending down the side of the source trenches and adjacent to source electrodes 338a/338b are source electrodes 339a/339b. Source electrodes 338a/338b and 339a/339b may be recessed below the top surface of semiconductor body 302 and may be, for example, recessed to a depth that is approximately level with the top etched surface of channel region 308. Source electrodes 338a/338b may extend to a depth between 0.9-1.8 um, for example, below the top surface of the semiconductor body and may extend within 0.1-0.3 um, for example, of the bottom of the trenches. Source electrodes 339a/339b may extend into the drift region and in particular, may extend to a depth between 0.4-0.8 um, for example, below the top surface of the semiconductor body. Notably, however, source electrodes 339a/339b do not extend to the same depth as source electrodes 338a/338b and in particular, may extend to the same depth as gate electrode 324. (e.g., as shown in FIG. 3N, source electrodes 339a/339b may be 0.5-1.0 um shallower than source electrodes 338a/338b). As shown, source contact 340 contacts both source electrodes 338a/338b and 339a/339b, thereby electrically connecting the source electrodes, source region 310, and channel region 308.

Source insulation layers 336a/336b continue to line the side-wall and bottom of the source trenches, insulating source electrodes 338a/338b and 339a/339b from drift region 306. Insulation layers also extend between source electrodes 338a/338b and source electrodes 339a/339b and extend below source electrodes 339a/339b towards the bottom of the trenches, the insulation layers along the side-wall of the source trenches thereby being thicker substantially along the drift region.

According to this embodiment of the invention, gate trench 322 continues to extend to the same depth as source trenches 332a/332b and may have a width of approximately 0.3 um, for example. As indicated, source electrodes 339a/339b and gate electrode 324 may extend to the same depth below the top surface of the semiconductor body 302.

According to an example fabrication process for device 300N, source electrodes 338a/339b and 339a/339b may be formed using a polysilicon plug process, as is known in the art.

Note that semiconductor body 302 and the source/gate trench depths of device 300N are not restricted to the form shown in FIG. 3N and the semiconductor body and trench depths of the device may also resemble the embodiments shown in FIGS. 3E, 3F, 3H, and 3I, for example. Note that the use of multiple source electrodes as described for device 300N is also applicable to device 300A, for example.

Referring now to FIG. 3O and FIG. 3P, there is shown example semiconductor device 300P according to an embodiment of the invention. Note that FIG. 3P shows a cross-sectional top down view of device 300P. Device 300P is similar to device 300G, for example, but now includes a plurality of Schottky diodes 350 integrated with MOSFETs. In particular, as shown in FIG. 3P, openings may be formed in the top surface of semiconductor body 302 through source region 310 and channel region 308, thereby exposing drift region 306. When source contact 340 is applied to the surface of semiconductor body 302, the source contact makes a Schottky contact to the drift region, thereby forming Schottky diodes 350. As an example, source contact 340 may be aluminum. Alternatively, a Schottky-forming metal may be applied to the exposed drift region to form the Schottky diodes. Thereafter, source contact 340 is applied over the Schottky-forming metal. As shown in FIG. 3P, guard rings 354 of the second conductivity type (e.g., P-type) may be formed within the drift region along the edges of the Schottky diodes.

Note that semiconductor body 302 and the source/gate trench depths of device 300P are not restricted to the form shown in FIG. 3O and may resemble the embodiments shown in FIGS. 3E, 3F, 3H, and 3I, for example, and similarly, the structure of the trench-based source electrodes and trench-based gate electrodes may resemble the embodiments shown in FIGS. 3J-3N, for example, and combinations thereof. Furthermore, the integration of Schottky diodes is also applicable to the embodiments of the invention shown in FIGS. 3A-3D, for example, and variations thereof.

Figure 3Q:
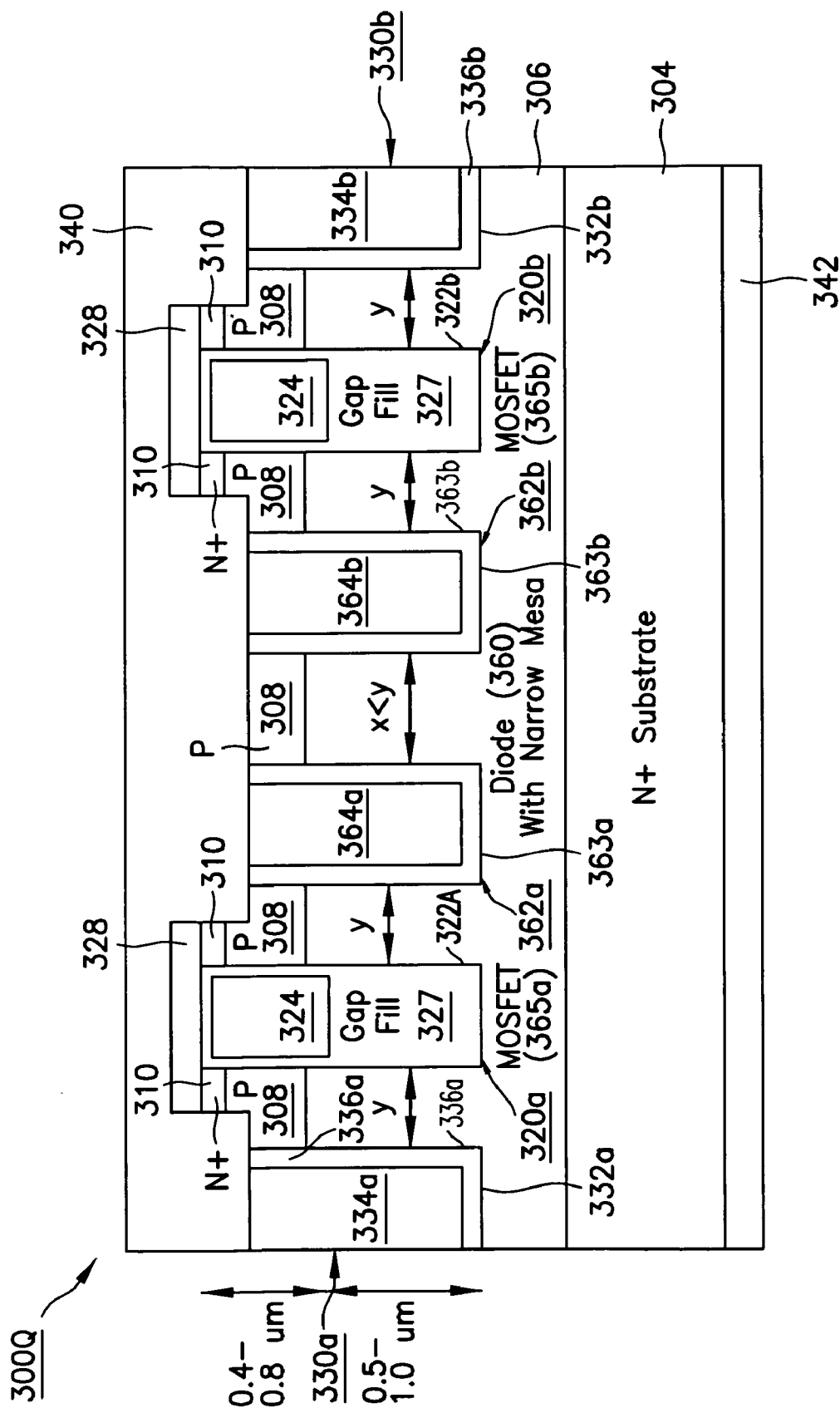
FIG. 3Q shows an alternate embodiment of the example device shown in FIG. 3A, the example device also including a plurality of P-N diodes.

Referring now to FIG. 3Q, there is shown example semiconductor device 300Q according to an embodiment of the invention. Device 300Q is similar to device 300E, for example, but now includes a plurality of P-N diodes 360 that help prevent avalanche breakdown of the device in the off state. In particular, device 300Q includes a plurality of trench-based gate electrodes 320a/320b and a plurality of trench-based source electrodes 330a/330b, similar to device 300E, for example. Here, however, rather than adjacent trench-based gate electrodes 320a/320b being separated by a single trench-based source electrode, they are now separated by two trench-based source electrodes 362a and 362b and a P-N diode 360. Accordingly, device 300Q includes a plurality MOSFETs, such as MOSFETs 365a and 365b, interleaved with a plurality of P-N diodes, such as diode 360.

Trench-based source electrodes 362a/362b are similar to trench-based source electrodes 330a/330b and include source trenches 363a and 363b and conductive insulated source electrodes 364a and 364b. Source trenches 363a/363b and source electrodes 364a/364b have the same depths as source trenches 332a/332b and source electrodes 334a/334b, respectively. As shown, source contact 340 contacts source electrodes 364a/364b, thereby electrically connecting all source electrodes, the source region, and the channel region.

As shown in FIG. 3Q, the mesa region of the semiconductor body between trenches 363a and 363b is etched to expose channel region 308. This exposed portion of the channel region contacts source contact 340, thereby forming P-N diode 360. Note that according to this embodiment of the invention, the distance "X" between source trenches 363a and 363b (i.e., the region that forms P-N diode 360) is narrower than the distance "y" between gate trenches 322a/322b and source trenches 332a/332b and 363a/363b.

Note that semiconductor body 302 and the source/gate trench depths of device 300Q are not restricted to the form shown in FIG. 3Q and may resemble the embodiments shown in FIGS. 3F-3I, for example, and similarly, the structure of the trench-based source electrodes and trench-based gate electrodes may resemble the embodiments shown in FIGS. 3J-3N, for example, and combinations thereof. Furthermore, the integration of P-N diodes is also applicable to the embodiments of the invention shown in FIGS. 3A-3D, for example, and variations thereof.

Referring now to FIG. 3R, there is shown example semiconductor device 300R according to an embodiment of the invention. Device 300R is similar to device 300G, for example. Here, however, source electrodes 334a/334b and/or gate electrode 324 are now proud, thereby reducing the resistance of the electrodes. Specifically, gate electrode 324 may extend above the top surface of semiconductor body 302, into insulation cap 328. Similarly, source electrodes 334a/334b may extend upward above the top etched surface of channel region 308, for example. According to a further aspect of the invention, the top of the gate and source electrodes may be silicided, thereby forming silicide contacts 325 and 335a/335b, respectively, which contacts reduce the sheet resistance of the electrodes.

Note that the use of proud source and gate electrodes is also applicable to the embodiments of the invention shown in FIGS. 3A-3F and 3H-3Q, for example.

Referring now to FIG. 4A, there is shown example semiconductor device 400A according to an embodiment of the invention. Device 400A includes a semiconductor body 402 that is similar to semiconductor body 302, for example, of device 300A. In particular, semiconductor body 402 includes a highly doped drain region 404, a drift region 406, and a highly doped source region 410, each of a first conductivity type, and a channel region 408 of a second conductivity type opposite to that of the first conductivity type. According to this embodiment of the invention, drift region 406 is uniformly doped and has a lower concentration of impurities than drain region 404.

Semiconductor device 400A further includes a plurality of trench-based gate electrodes, such as trench-based gate electrode 420, interleaved an alternating fashion with a plurality of trench-based source electrodes, such as trench-based source electrodes 430a and 430b. Preferably, the trench-based gate electrodes and trench-based source electrodes are formed in a cellular design (e.g., hexagonal or rectangular), although a strip design can also be used.

Trench-based source electrodes 430a/430b include source trenches 432a and 432b that extend through source region 410 and channel region 408 and into drift region 406 and may extend, for example, to a depth between 0.9-1.8 um below the top surface of semiconductor body 402. Within source trenches 432a/432b are conductive insulated source electrodes 434a and 434b, respectively. The source electrodes may be recessed below the top surface of semiconductor body 402 and in particular, below the top surface of channel region 408. According to this embodiment of the invention, source electrodes 434a/434b extend within the source trenches beyond the bottom of channel region 408, for example, but do not extend to the bottom of the source trenches. Rather, the source electrodes extend above the bottom of the trenches and extend to substantially the same depth as gate electrode 424. For example, as shown in FIG. 4A, the source electrodes may extend to a depth between 0.4-0.8 um, for example, below the top surface of the semiconductor body and may extend above the bottom of the source trenches by 0.5-1.0 um, for example.

Source insulation layers 436a and 436b line a portion of the side-wall and bottom of source trenches 432a/432b, thereby insulating the source electrodes from drift region 406. However, the source insulation layers do not line the trench side-wall along etched source region 410 and a portion of etched channel region 408, leaving these areas exposed. According to this embodiment of the invention, source insulation plugs 437a and 437b fill the void/gap below the bottom of the source electrodes.

Trench-based gate electrode 420 is similar to trench-based gate electrode 320 of device 300A, for example, and includes gate trench 422 and conductive insulated gate electrode 424. Gate trench 422 extends to substantially the same depth as source trenches 432a/432b. Gate electrode 424 may be recessed below the top surface of semiconductor body 402 and extends above and below the top and bottom surfaces of channel region 408. According to this embodiment of the invention, the gate electrode does not extend to the bottom of the gate trench and has substantially the same depth as source electrodes 436a/436b, as indicated above.

Gate insulation layer 426 lines the side-wall and bottom of gate trench 420 and gate insulation plug 427 fills the void/gap below the bottom of the gate electrode. Gate insulation cap 428 covers the top of gate electrode 424 and fills the remainder of the gate trench. Gate insulation cap 428 may also extend above the top surface of semiconductor body 402 and laterally over a portion of the top surface of source region 410.

Semiconductor device 400A further includes drain contact 442, which is in electrical contact with drain region 404, and source contact 440 along the top surface of semiconductor body 402. Source contact 440 fills the upper portion of source trenches 432a/432b and electrically contacts source electrodes 434a/434b, channel region 408, and source region 410, as similarly described for device 300A, for example.

In general, fabrication steps known in the art may be used to form device 400A. In particular, as similarly described above for device 300A, simultaneous steps, such as the etching of the trenches, can be used to form the trench-based gate electrodes 420 and the trench-based source electrodes 430a/430b.

Referring now to FIG. 4B, there is shown example semiconductor device 400B according to an embodiment of the invention. Device 400B is similar to device 400A but now includes an etched-back source region 410 and an etched-back channel region 408 along the side-wall of source trenches 432a/432b, as similarly described for device 300E, for example. As illustrated, source electrodes 434a/434b may be recessed below the top surface of semiconductor body 402 to a depth, for example, that is approximately level with the top etched surface of channel region 408. In addition, gate insulation cap 428 may laterally cover the entire top surface of source region 410. As similarly described for device 300E, source contact 440 covers the top surface of semiconductor body 402 and fills the upper portion of source trenches 432a/432b and also the etched back areas of the source region and channel region, thereby electrically connecting the source electrodes, channel region, and source region.

Referring now to FIG. 4C, there is shown example semiconductor device 400C according to an embodiment of the invention. Device 400C is similar to device 400B and has a structure similar to that of device 300F, described above. In particular, the source trenches 432a/432b and gate trench 422 of device 400C now extend through drift region 406 and into drain region 404. As similarly described for device 300F, the depth of drift region 406/drain region 404 and/or the depth of the source and gate trenches 432a/432b/422 may be varied in order for the source trenches and gate trench to extend into the drain region.

Note that the extension of the source and gate trenches into the drain region is also applicable to the embodiment of the invention shown in FIG. 4A.

Referring now to FIG. 4D, there is shown example semiconductor device 400D according to an embodiment of the invention. Device 400D is similar to device 400B and has a structure similar to that of device 300G described above. In particular, device 400D now includes a buffer layer 407 of the same conductivity as drain region 404 and drift region 406 (e.g., N-type) that is epitaxially grown between these two regions. Here, source trenches 432a/432b and gate trench 422 extend into drift region 406 but not into buffer layer 407. Accordingly, a portion of drift region 406 remains below the bottom of the trenches. As similarly described for device 300G, a specific distance between the bottom of the trenches and the top of the buffer region is not required and may be varied for design purposes.

Note that the addition of a buffer region 407 is also applicable to the embodiment of the invention shown in FIG. 4A.

Referring now to FIG. 4E, there is shown example semiconductor device 400E according to an embodiment of the invention. Device 400E is similar to device 400D and has a structure similar to that of device 300H described above. In particular, the source trenches 432a/432b and gate trench 422 of device 400E now extend through drift region 406 and into buffer region 407. As similarly described for device 300H, the depth of drift region 406/buffer region 407 and/or the depth of source and gate trenches 432a/432b/422 may be varied in order for the source trenches and gate trench to extend into the buffer region.

Note that the addition of a buffer region 407 and the extension of source and gate trenches into this region is also applicable to the embodiment of the invention shown in FIG. 4A.

Figures 4F, 4G:
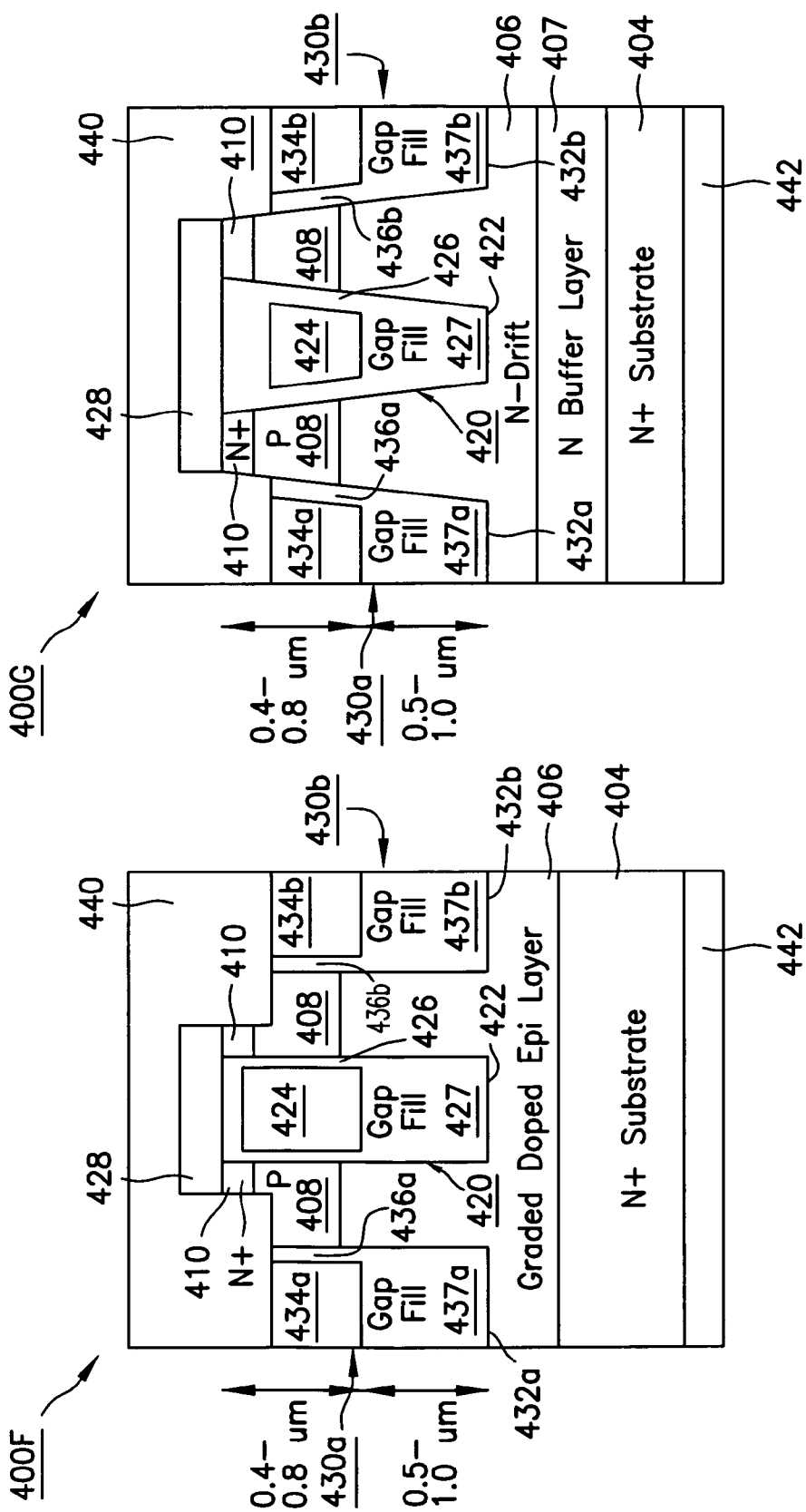

Referring now to FIG. 4F, there is shown example semiconductor device 400F according to an embodiment of the invention. Device 400F is similar to device 400B and has a structure similar to that of device 300I described above. In particular, device 400F includes a drift region 406 in which the doping increases monotonically from channel region 408 to drain region 404, rather than being uniformly doped. Here, source trenches 432a/432b and gate trench 422 extend within semiconductor body 402 to a depth within the drift region.

Note that the use of a non-uniformly doped drift region is also applicable to the embodiment of the invention shown in FIG. 4A.

Referring now to FIG. 4G, there is shown example semiconductor device 400G according to an embodiment of the invention. Device 400G is similar to device 400D and has a structure similar to that of device 300J described above. In particular, the side-wall of the source trenches 432a/432b and gate trench 422 of device 400D now slope inward from the surface of semiconductor body 402 through source region 410 and channel region 408, and into drift region 406 towards the bottom of the trenches (not that source region 410 and channel region 408 are not be etched-back). As similarly described for device 300J, this slope increases the area of the drift region between the source and gate trenches as the trenches descend through the drift region away from channel region 408, thereby increasing the charge along the drift region and improving the on-resistance of the device. Similar to device 300J, according to this embodiment of the invention, source and gate insulation layers 436a/436b/426, source and gate insulation plugs 437a/437b/427, and source and gate electrodes 434a/434b/424 also slope inward along the full length of the source and gate trenches, the electrodes thereby decreasing in width.

Note that semiconductor body 402 and the source/gate trench depths of device 400G are not restricted to the form shown in FIG. 4G and the semiconductor body and trench depths of the device may also resemble the embodiments shown in FIGS. 4B, 4C, 4E, and 4F, for example.

Referring now to FIG. 4H, there is shown example semiconductor device 400H according to an embodiment of the invention. Device 400H is similar to device 400G and has a structure similar to that of device 300K described above. In particular, rather than the side-wall of the source trenches 432a/432b and gate trench 422 being sloped along their entire length, as described for device 400G, the side-wall of the source trenches and gate trench now extend at a substantially vertical angle through source region 410 and channel region 408, and possibly into drift region 406. Thereafter, the side-walls of the trenches slope inward substantially along the drift region towards the bottom of the trenches, thereby increasing the area and charge of the drift region. As indicated, having the trench side-walls descend vertically through the channel region 408 rather than at a sloped angle, ensures that the channel region is as short as possible while also allowing for improved on-resistance due to an enlarged drift area.

According to this embodiment of the invention, the source and gate trenches may have a depth of approximately 1.6 um, for example, from the top surface of the semiconductor body and the source and gate electrodes may extend to a depth of approximately 0.8 um, for example, from the top surface of the semiconductor body. Note that the source and gate trenches and source and gate electrodes may be formed such that the electrodes extend only through the vertical portion of the trenches, the electrodes thereby having substantially vertical side-walls.

Similar to device 300K, according to an example fabrication process, the source and gate trenches of device 400H may be formed in two steps. During the first step, the top portion of each trench is formed using a chemical etching process, thereby yielding an approximate 90° side-wall angle. During the second step, the bottom portion of each trench is formed using an etch recipe, thereby yielding the sloped sidewall.

Note that semiconductor body 402 and the source/gate trench depths of device 400H are not restricted to the form shown in FIG. 4H and the semiconductor body and trench depths of the device may also resemble the embodiments shown in Figures in FIGS. 4A-4C and 4E-4F, for example.

Figure 4I:
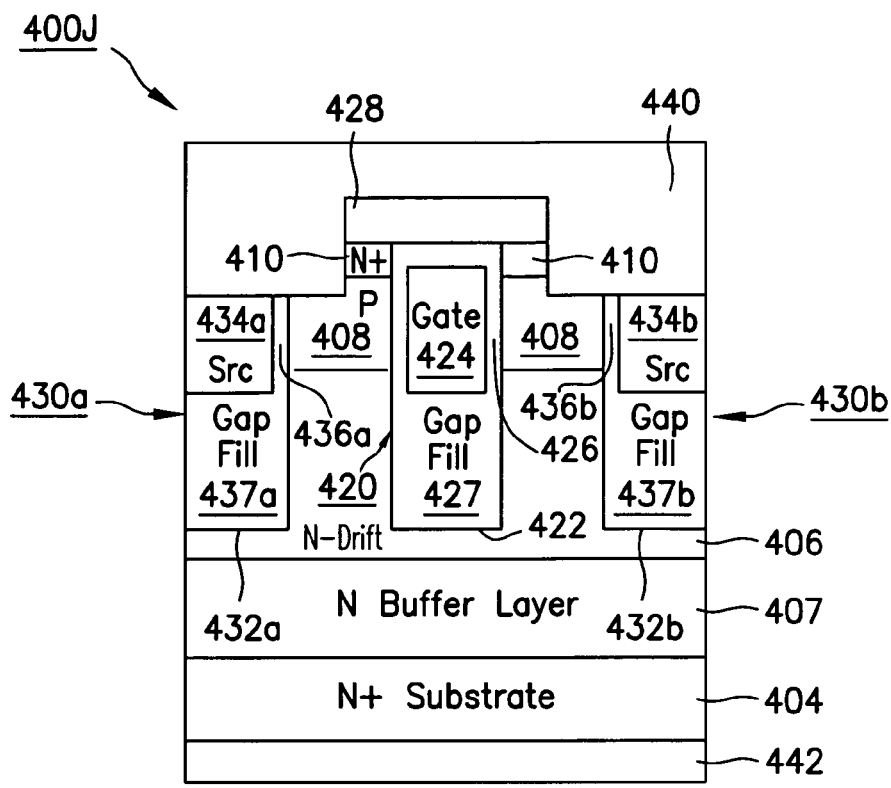

Referring now to FIGS. 4I and 4J, there is shown example semiconductor device 400J according to an embodiment of the invention. Note that FIG. 4J shows a cross-sectional top down view of device 400J. Device 400J is similar to device 400D and has a structure similar to device 300P described above and in particular, includes a plurality of Schottky diodes 450 integrated with MOSFETs. As shown in FIG. 4J, openings are formed in the top surface of semiconductor body 402 through source region 410 and channel region 408, thereby exposing drift region 406. Source contact 440 may contact the drift region, thereby forming Schottky diodes 450. Alternatively, a Schottky-forming metal may be applied to the exposed drift region to form the Schottky diodes. As shown in FIG. 4J, guard rings 454 of the second conductivity type (e.g., P-type) may be formed within the drift region along the edges of the Schottky diodes.

Note that semiconductor body 402 and the source/gate trench depths of device 400J are not restricted to the form shown in FIG. 4I and may resemble the embodiments shown in FIGS. 4A-4C and 4E-4F, for example, and similarly, the structure of the trench-based source electrodes and trench-based gate electrodes may resemble the embodiments shown in FIGS. 4G and 4H, for example, and combinations thereof.

Figure 4K:
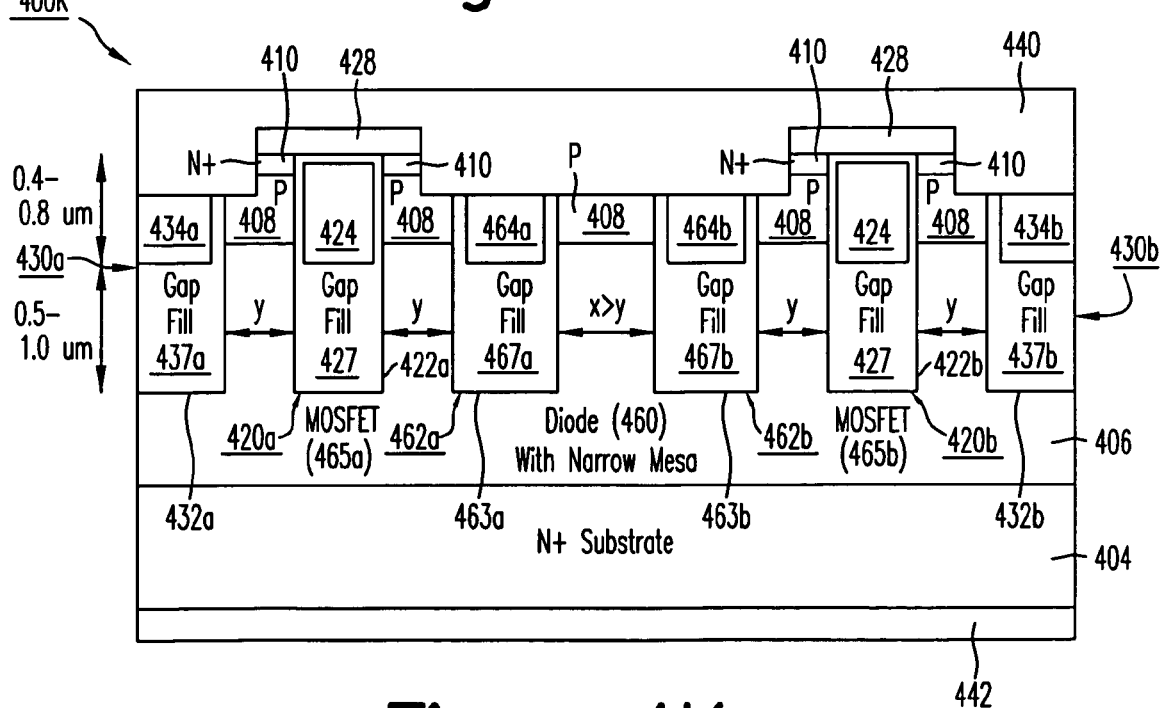
FIG. 4K shows an alternate embodiment of the example device shown in FIG. 4A, the example device also including a plurality of P-N diodes.

Referring now to FIG. 4K there is shown example semiconductor device 400K according to an embodiment of the invention. Device 400K is similar to device 400B and has a structure similar to that of device 300Q described above. In particular, device 400K includes a plurality of trench-based gate electrodes 420a/420b and a plurality of trench-based source electrodes 430a/430b, similar to device 400B. Here, however, rather than adjacent trench-based gate electrodes 420a/420b being separated by a single trench-based source electrode, they are now separated by two trench-based source electrodes 462a and 462b and a P-N diode 460. Accordingly, device 400K includes a plurality MOSFETs, such as MOSFETs 465a and 465b, interleaved with a plurality of P-N diodes, such as diode 460.

Trench-based source electrodes 462a/462b are similar to trench-based source electrodes 430a/430b and include source trenches 463a/463b, conductive insulated source electrodes 464a/464b, and source insulation plugs 467a and 467b below the electrodes. Source trenches 463a/463b and source electrodes 464a/464b have the same depths into semiconductor body 402 as source trenches 432a/432b and source electrodes 434a/434b, respectively. As shown, source contact 440 contacts source electrodes 464a/464b, thereby electrically connecting all source electrodes, the source region, and the channel region.

As illustrated in FIG. 4K, the mesa region of the semiconductor body between trenches 463a and 463b is etched to expose channel region 408. This exposed portion of the channel region contacts source contact 440, thereby forming P-N diode 460. Note that according to this embodiment of the invention, the distance "X" between source trenches 463a and 463b (i.e., the region that forms P-N diode 460) is wider than the distance "y" between gate trenches 422a/422b and source trenches 432a/432b and 463a/463b.

Note that semiconductor body 402 and the source/gate trench depths of device 400K are not restricted to the form shown in FIG. 4K and may resemble the embodiments shown in FIGS. 4A and 4C-4F, for example, and similarly, the structure of the trench-based source electrodes and trench-based gate electrodes may resemble the embodiments shown in FIGS. 4G and 4H, for example, and combinations thereof.

Referring now to FIG. 4L there is shown example semiconductor device 400L according to an embodiment of the invention. Device 400L is similar to device 400D. Here, however, source electrodes 434a/434b and/or gate electrode 422 are proud, thereby reducing the resistance of the electrodes. Specifically, gate electrode 422 may extend above the top surface of semiconductor body 402 into insulation cap 428, for example. Similarly, source electrodes 434a/434b may extend above the top etched surface of channel region 408, for example. According to a further aspect of the invention, the top of the gate and source electrodes may be silicided, thereby forming silicide contacts 425 and 435a/435b, respectively, which reduce the sheet resistance of the electrodes.

Note that the use of proud source and gate electrodes is also applicable to the embodiments of the invention shown in FIGS. 4A-4C and 4E-4K, for example.

Referring now to FIG. 5, there is shown example semiconductor device 500 according to an embodiment of the invention. Device 500 has a semiconductor body 502 that includes a highly doped drain region 504, a drift region 506 of lower concentration of impurities than the drain region, and a highly doped source region 510, each of a first conductivity type (e.g., N-type). Semiconductor body 502 further includes a channel region 508 of a second conductivity type opposite to that of the first conductivity type (e.g., P-type).

Semiconductor device 500 further includes a plurality of trench-based gate electrodes, such as trench-based gate electrode 520, and a plurality of source trenches, such as source trenches 532a and 532b, the trench-based gate electrodes and source trenches being arranged in an interleaved fashion. Trench-based gate electrode 520 is similar to trench-based gate electrode 220 of device 200A, for example, and includes gate trench 522 and conductive insulated gate electrode 524. Gate trench 522 extends from the top surface of semiconductor body 502 into drift region 506 to a depth below channel region 508. Gate electrode 524 may be recessed below the top surface of semiconductor body 502 and extends above and below the top and bottom surfaces of channel region 508, for example. Gate insulation layer 526 lines the side-wall and bottom of gate trench 522, insulating the gate electrode from the source region, channel region, and drift region. Gate insulation cap 528 covers the top of gate electrode 524 and may extend above the top surface of semiconductor body 502, laterally covering a portion of the top surface of source region 510.

Source trenches 532a/532b extend from the top surface of the semiconductor body through source region 510 and channel region 508, and into drift region 506 to a depth that is approximately the same as gate trench 522. For example, the trenches may extend approximately 0.5 um, for example, below the top surface of the semiconductor body. The source trenches maybe formed using a contact mask, for example.

Semiconductor device 500 further includes highly doped implant regions 512a and 512b of the second conductivity type (e.g., P-type) and doped implant region 513 of the first conductivity type (e.g., N-type). Implant regions 512a/512b are formed within drift region 506 along the lower side-wall and bottom of source trenches 532a/532b. These implant regions extend a significant distance below the depth of gate trench 522 and in particular, may extend 0.4 um, for example, below the bottom of the source trenches. Implant regions 512a/512b also extend laterally towards one another and in particular, may have a lateral spacing of approximately 0.4 um, for example, between one another. Implant regions 512a/512b are similar to a deep implant and may be formed, for example, using high energy and very little diffusion.

Implant region 513 is also formed within drift region 506 and in particular, is formed between implant regions 512a/512b below gate trench 522 (as an example, Implant region 513 may have a doping of approximately 7e12 cm-2). This region may be formed prior to the formation of gate insulation layer 526 and prior to filling the gate trench with polysilicon.

Semiconductor device 500 further includes drain contact 542, which electrically contacts drain region 504, and source contact 540 along the top surface of semiconductor body 502. Source contact 540 extends over gate insulation cap 528 and contacts the exposed top surface of source region 510. In addition, source contact 540 fills source trenches 532a/532b, thereby forming source electrodes 533a and 533b within the trenches, each source electrode contacting channel region 508 and source region 510 along the side-wall of the source trenches. A hot metal process may be used to fill source trenches 532a/532b with source contact 540.

Notably, source electrodes 533a and 533b operate similar to the trench-based source electrodes as described above, providing an improved breakdown voltage for device 500 by pushing the depletion region further into the drift region when the device is in the off-state.

Referring now to FIG. 6A, there is shown example semiconductor device 600A according to an embodiment of the invention. Device 600A has a semiconductor body 602 that includes, for example, a highly doped drain region 604, a drift region 606 of lower concentration of impurities than the drain region, and a highly doped source region 610, each of a first conductivity type (e.g., N-type). Semiconductor body 602 further includes a channel region 608 of a second conductivity type opposite to that of the first conductivity type (e.g., P-type). Although not required, semiconductor body 602 also includes buffer region 607, which has a lower concentration of impurities than the drain region and a higher concentration of impurities than the drift region.

Semiconductor device 600A further includes a plurality of trench-based gate electrodes, such as trench-based gate electrode 620a and 620b, and a plurality of source contact trenches, such as source contact trench 614. The source contact trenches are formed in the surface of semiconductor body 602 along the mesa regions between adjacent trench-based gate electrodes. As shown with source contact trench 614, the contact trenches extend from the top surface of the semiconductor body, through source region 610, and into channel region 608. In this way, the source contact trenches provide an exposed side surface of channel region 610 and at least an exposed top surface of channel region 608, thereby providing a point of contact between these regions and source contact 640.

The trench-based gate electrodes include gate trenches 622a and 622b and conductive insulated gate electrodes 624a and 624b disposed therein. Gate trenches 622a/622b extend from the top surface of semiconductor body 602 through source region 610 and channel region 608, and into drift region 606, for example, and in particular, may extend to a depth between 1.0-2.1 um, for example, below the top surface of the semiconductor body. The width of the gate trenches may be between 0.4-0.5 um, for example, and the distance between adjacent trenches may be between 0.5-1.0 um, for example. As such, device 600A may have a pitch between 0.9-1.5 um.

Gate insulation layers 626a and 626b line the bottom and side-wall of trenches 622a/622b and have a non-uniform thickness. In particular, the gate insulation layers are relatively thin along the side-wall of the trenches adjacent to channel region 608 and possible a portion of drift region 606 and thereafter increase in thickness along the bottom and side-wall of the trenches adjacent to drift region 606.

Gate electrodes 624a/624b are disposed within the gate trenches and have varying widths (i.e., are "T-shaped") as a result of the varying thickness of the gate insulation layers. In particular, the electrodes extend at a first width from the surface of the semiconductor body to depth below the bottom of channel region 608, for example, and may extend, for example, 0.4-0.8 um below the top surface of the semiconductor body. Thereafter, the gate electrodes extend at a reduced width along drift region 606 and in particular, may extend an additional 0.5-1.0 um, for example. As shown, 0.1-0.3 um, for example, of a thick gate insulation layer may extend below the bottom of the electrodes. Covering the top surface of the electrodes and extending laterally over the top surface of source region 610 are gate insulation caps 628a and 628b.

In general, the reduced thickness of the gate insulation layers between the gate electrodes and channel region helps maintain a low threshold voltage. The increased thickness of the insulation layers between the gate electrodes and the drift region reduces the coupling between the gate electrodes and drift region.

Semiconductor device 600A further includes drain contact 642 that electrically contacts drain region 604, and source contact 640 along the top surface of semiconductor body 602. Source contact 640 extends over gate insulation caps 628a/628b and fills the source contact trenches 614, contacting the exposed surfaces of the channel and drift regions.

Referring now to FIG. 6B, there is shown example semiconductor device 600B according to an embodiment of the invention. Device 600B is similar to device 600A. According to this embodiment of the invention, however, each gate electrode 624a/624b is now split into multiple vertical gate electrodes of different lengths (e.g., three electrodes), including gate electrodes 621a/621b, 623a/623b, and 625a/625b, each disposed within gate trenches 622a/622b.

As shown with trench-based gate electrode 620a for example, gate electrode 623a extends down the center of gate trench 622a and gate electrodes 621a and 625a extend down opposing sides of the gate trench, each adjacent to channel region 608 and gate electrode 621a and each possibly having a smaller width, for example, than that of gate electrode 623a. The center gate electrode 623a may extend within the gate trench to a depth between 0.9-1.8 um, for example, below the top surface of the semiconductor body and may extend to within 0.1-0.3 um, for example, of the bottom of the trench. The side gate electrodes 621a and 625a are the same length and may extend within the gate trench to a depth between 0.4-0.8 um, for example, below the top surface of the semiconductor body. Notably, however, gate electrodes 621a and 625a do not extend to the same depth as gate electrode 623a and in particular, may be shallower than gate electrode 623a by 0.5-1.0 um, for example. As shown, each gate electrode 621a/623a/625a extends to a depth below channel region 608, with electrode 623a extending an additional length along the drift region. Note that all three electrodes are connected to the gate contact (not shown in the Figure).

Gate insulation layers 626a/626b continue to line the bottom and side-wall of trenches 622a/622b and continue to have a non-uniform thickness, being thinner along the channel region and thicker along the drift region, as similarly described for device 600A. In addition, the gate insulation layers now extend between the adjacent gate electrodes 621a/623a/625a and 621b/623b/625b. As shown, gate insulation caps 628a/628b continue to cover the top surface of the electrodes.

According to an example fabrication process for device 600B, gate electrodes 621a/621b, 623a/623b, and 625a/625b maybe formed using a polysilicon plug process, as is known in the art.

Referring now to FIG. 6C, there is shown example semiconductor device 600C according to an embodiment of the invention. Device 600C is similar to device 600A but now includes a plurality of trench-based source electrodes. Specifically, device 600C includes a plurality of trench-based gate electrodes, such as trench-based gate electrode 620, interleaved in an alternating fashion with a plurality of trench-based source electrodes, such as trench-based source electrode 630. Trench-based gate-electrode 620 has a structure as described above for device 600A (i.e., "T-shaped" gate electrode).

Trench-based source electrode 630 is similar in structure to trench-based gate electrode 620 and includes source trench 632 and conductive insulated source electrode 634 disposed therein. Source trench 632 extends from the surface of semiconductor body 602, through source region 610 and channel region 608, and into drift region 606, for example, and in particular, extends to the same depth as gate trench 622. As illustrated in FIG. 6C, a portion of source region 610 and channel region 608 are etched back from the side-wall of source trench 632. The width of source trench 632 may be between 0.4-0.5 um, for example, and may have the same width as gate trench 622. The distance between adjacent gate and source trenches may be between 0.4-0.6 um, for example. As such, device 600C may have a half pitch between 0.8-1.1 um, for example, and a full pitch between 1.6-2.2 um, for example.

Source insulation layer 636 lines the bottom and side-wall of trench 632 along channel region 608 and drift region 606 and has a non-uniform thickness that is similar to gate insulation layer 626. In particular, the source insulation layer is relatively thin along the side-wall of the trench adjacent to the channel region and possibly a portion of the drift region and thereafter increases in thickness along the bottom and side-wall of the trench adjacent to the drift region, helping to reduce the coupling between the source electrode and drift region.

Source electrode 634 is disposed within the source trench and has a varying width as a result of the varying thickness of the source insulation layer (i.e., is "T-shaped"). In particular and as illustrated in FIG. 6C, the electrode may be recessed below the top surface of semiconductor body 602 to a depth, for example, that is approximately level with the top etched surface of channel region 608. Thereafter, the electrode resembles gate electrode 624, extending at a first width to the same depth, for example, as the thicker portion of the gate electrode and then extending at a reduced width to the same depth, for example, as the thinner portion of gate electrode 624 (note that the varying widths between the source and gate electrodes may be the same). As shown, source contact 640 continues to cover the top surface of semiconductor body 602 and now fills the upper portion of source trench 632 and also the etched back areas of the source region and channel region, thereby electrically contacting the source electrodes, channel region, and source region.

As compared to device 600A, device 600C has a reduced gate-drain charge and also a reduced gate charge. However, device 600C has a higher on-resistance.

Referring now to FIG. 6D, there is shown example semiconductor device 600D according to an embodiment of the invention. Device 600D has a structure similar to device 600C, including a plurality of alternating trench-based gate electrodes and trench-based source electrodes, such as trench-based gate electrode 620 and trench-based source electrode 630. According to this embodiment of the invention, however, rather than the source electrode 634 having a "T-shape" similar to that of gate electrode 624, the source electrode has a reduce size.

Specifically, trench-based gate-electrode 620 has a structure as described above for device 600A (i.e., "T-shaped" gate electrode). Trench-based source electrode 630 includes source trench 632 as described above for device 600C and includes source electrode 634 disposed therein that extends within the semiconductor body to the same depth as gate electrode 624. However, as shown in FIG. 6D, the source electrode now has a thin uniform width throughout (rather than a "T-shape"), with the width being similar to the thinner portion of gate electrode 624, for example. Source insulation layer 636 continues to line the side-wall and bottom of the source trench but is now thick throughout, similar to the lower portion of gate insulation layer 626.

As compared to device 600A, device 600D has a reduced gate-drain charge and also a reduced gate charge. However, device 600C has a higher on-resistance.

Figures 6E, 6F:
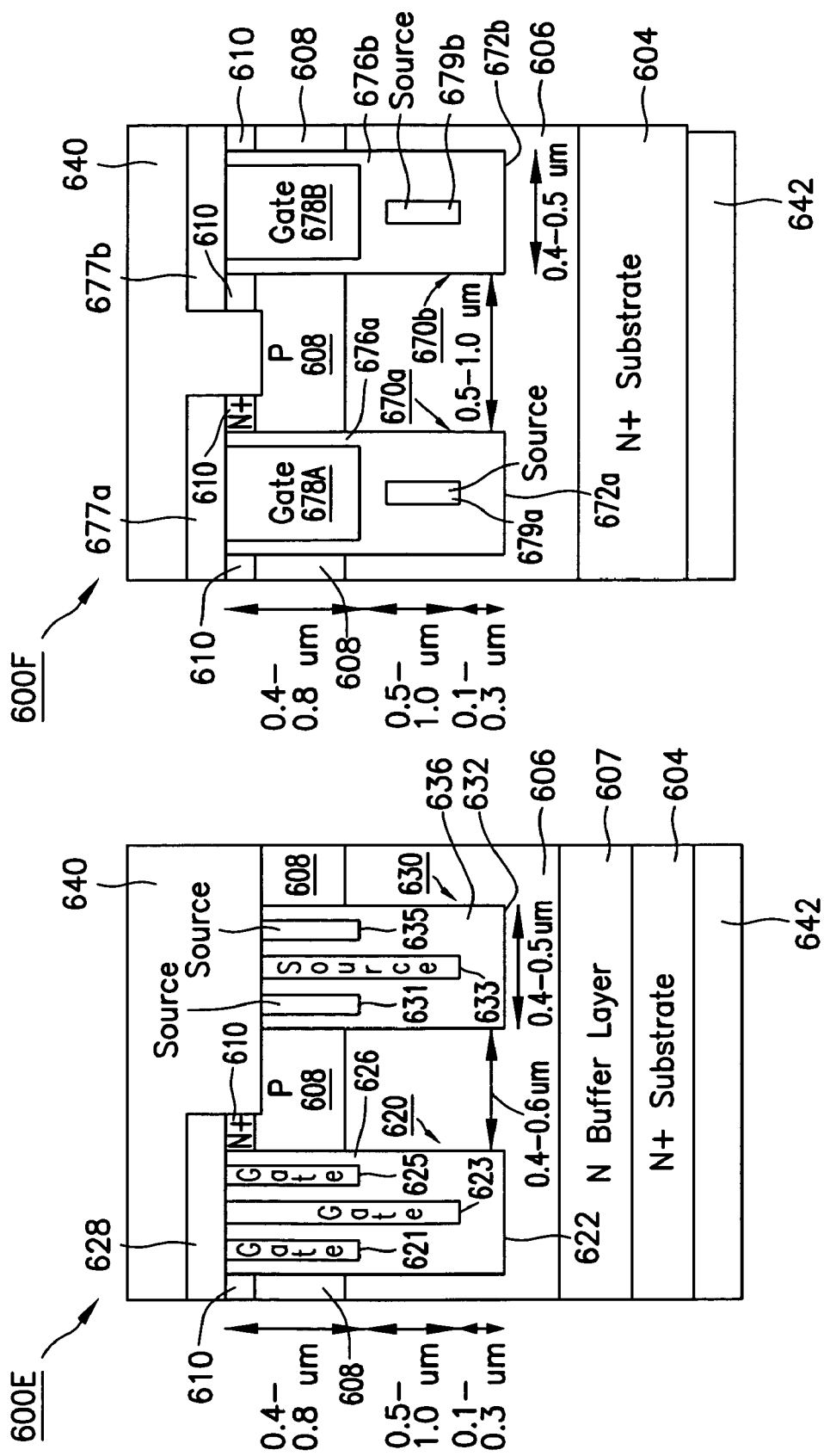
FIG. 6E shows alternate embodiment of the example device shown in FIG. 6B, the example device having multiple gate electrodes within each gate trench and multiple source electrodes within each source trench.
FIGS. 6F and 6G show cross-sectional views of example power semiconductor devices according to embodiments of the invention, the devices including trenches that have both gate and source electrodes formed therein.

Referring now to FIG. 6E, there is shown example semiconductor device 600E according to an embodiment of the invention. Device 600E has a structure similar to device 600C, including a plurality of alternating trench-based gate electrodes and trench-based source electrodes, such as trench-based gate electrode 620 and trench-based source electrode 630. According to this embodiment of the invention, however, the gate and source electrodes are now split into multiple (e.g., three) vertical electrodes.

For example, trench-based gate electrode 620 includes three vertical gate electrodes 621, 623, and 625 and has a structure as described above for device 600B. Trench-based source electrode 630 includes a source trench 632 as described above for device 600C and further includes three vertical source electrodes 631, 633, and 635 of different lengths, each disposed within the source trench. Source electrode 633 extends down the center of the source trench and source electrodes 631 and 635 extend down opposing sides of the source trench, each adjacent to source electrode 633 and each possibly having, for example, a smaller width than source electrode 633. The source electrodes may be recessed below the top surface of semiconductor body 602 and may be, for example, recessed to a depth that is approximately level with the top etched surface of channel region 608. Center source electrode 633 extends within the source trench and along the drift region and has a depth similar to the depth as center gate electrode 625. The side source electrodes 631 and 635 are the same length but shorter than center source electrode 633, extending within the source trench to a similar depth as side gate electrodes 621 and 625. As shown, source contact 640 contacts all three source electrodes 631/633/635, thereby electrically connecting the source electrodes, source region 610, and channel region 608.

Source insulation layer 636 continues to line the bottom and side-wall of source trench 632 and continues to have a non-uniform thickness, being thinner along the channel region and thicker along the drift region, as similarly described for device 600C. In addition, the source insulation layer now extends between the adjacent source electrodes 631/633/635.

As compared to device 600A, device 600E has a reduced gate-drain charge and also a reduced gate charge. However, device 600E has a higher on-resistance.

Referring now to FIG. 6F there is shown example semiconductor device 600F according to an embodiment of the invention. In general, device 600F has a structure similar to device 600A, however, each trench now includes both a source and a gate electrode. Specifically, device 600F includes a plurality of trench-based source/gate electrodes, such as trench-based source/gate electrodes 670a and 670b, and a plurality of source contact trenches, such as source contact trench 614, arranged in an alternating fashion. The source contact trenches 614 are as described above for device 600A.

Using trench-based source/gate electrode 670a as an example, each trench-based source/gate electrode includes a trench 672a and two electrodes disposed therein, including a conductive insulated gate electrode 678a and a conductive insulated source electrode 679a. Trench 672a extends from the top surface of semiconductor body 602 through the source and channel regions, and into drift region 606, for example, and in particular, may extend to a depth between 1.0-2.1 um, for example, below the top surface of the semiconductor body. The trench width may be between 0.4-0.5 um, for example, and the distance between adjacent trenches may be between 0.5-1.0 um, for example. As such, device 600F may have a pitch between 0.9-1.5 um.

Gate electrode 678a extends adjacent to channel region 608 and in particular, may extend from the surface of the semiconductor body to a depth between 0.4-0.8 um, for example, below the top surface of the semiconductor body. The gate electrode is connected to the gate contact (not shown in the Figure).

Source electrode 679a is disposed within the trench adjacent to drift region 608 and beneath gate electrode 678a and in particular, may extend to a depth between 0.5-1.0 um, for example, below the bottom of the gate electrode and may extend to within 0.1-0.3 um, for example, from the bottom of the trench.

Insulation layer 676a lines the bottom and side-wall of trench 672a and has a non-uniform thickness along the side-wall, as similarly described for device 600A. In particular, the insulation layer is thinner along the side-wall between the gate electrode and channel region, thereby keeping the threshold voltage low, and is thicker along the side-wall between the drift region and the source electrode, giving the source electrode a smaller width than the gate electrode and reducing the coupling between the source electrode and drift region. Insulation layer 676a also extends between gate electrode 678a and source electrode 679a, insulting the electrodes from one another. An insulation cap 677a may cover the top of trench 672a and extends laterally over the top surface of semiconductor body 602, covering the top surface of source region 610. As shown, the cap insulates the gate electrode from the source contact 640.

Source contact 640 extends over the top surface of semiconductor body 602 and contacts the source electrodes 679a/679b along a third dimension (not shown). The source contact also fills the source contact trench 614, contacting the exposed surfaces of the channel and drift regions.

Figures 6G, 7A:
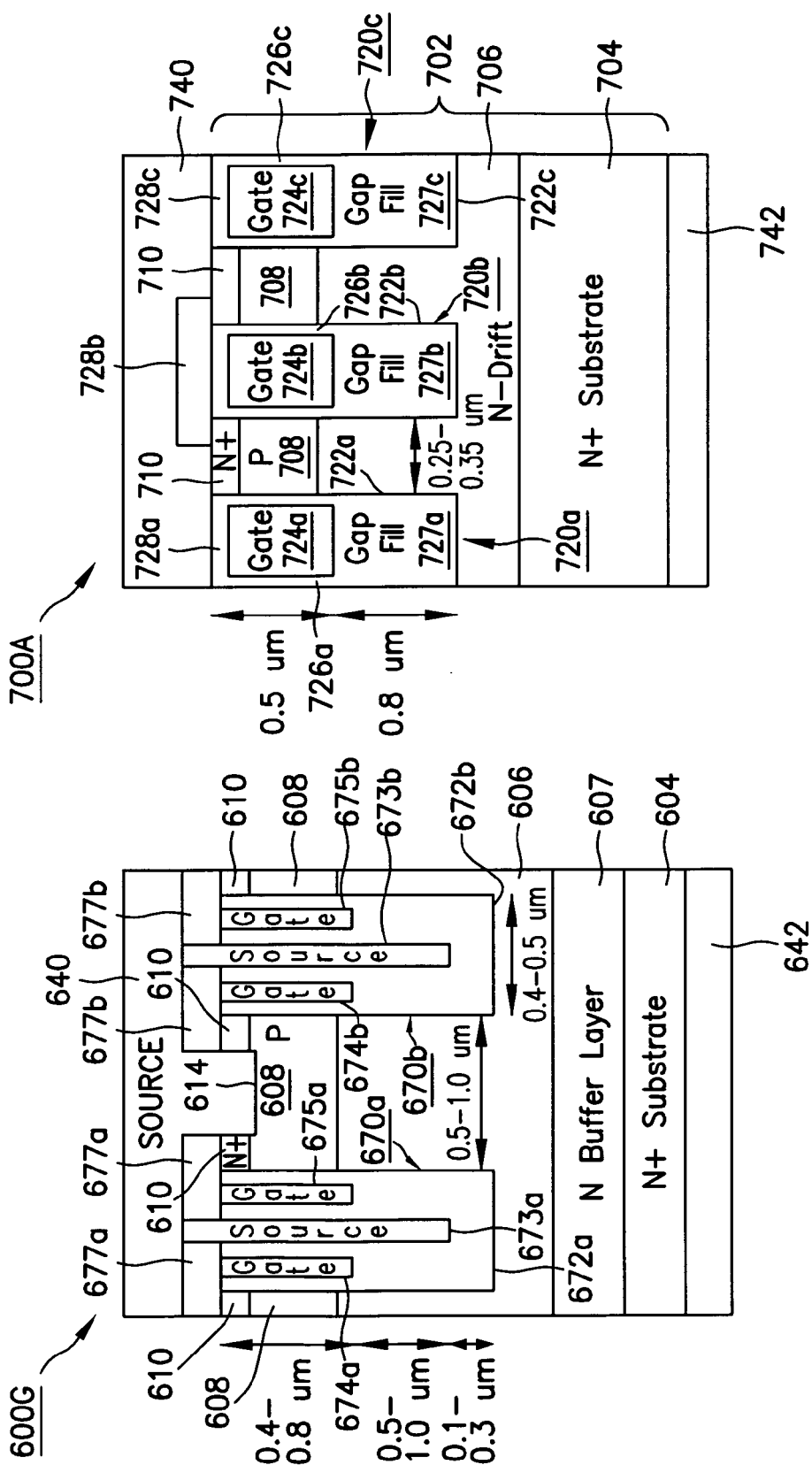
FIG. 7A shows a cross-sectional view of an example power semiconductor device according to an embodiment of the invention, the device including a plurality of gate trenches each with a gate electrode therein.

Referring now to FIG. 6G there is shown example semiconductor device 600G according to an embodiment of the invention. In general, device 600G has a structure similar to device 600F, including a plurality of trench-based source/gate electrodes 670a and 670b, but with a different gate electrode/source electrode configuration. Specifically, using trench-based source/gate electrode 670a as an example, each trench-based source/gate electrode includes a trench 672a and three electrodes, for example, disposed therein, including a conductive insulated source electrode 673a and two conductive insulated gate electrodes 674a and 675a. Source electrode 673a extends from the top surface of insulation cap 677a down through the insulation cap and through the center of the trench. The source electrode extends along the drift region and may extend to a depth between 0.9-1.8 um, for example, below the top surface of semiconductor body 602 and may extend to within 0.1-0.3 um, for example, from the bottom of the trench.

Gate electrodes 674a and 675a are the same length and extend from the surface of the semiconductor body, for example, down opposing sides of the trench, each adjacent to source electrode 673a and adjacent to channel region 608. The gate electrodes extend within the trench to a depth below channel region 608, for example, and in particular, may extend to a depth between 0.4-0.8 um, for example, below the top surface of the semiconductor body. However, gate electrodes 674a and 675a do not extend to the same depth as source electrode 673a and in particular, may be shallower than the source electrode by 0.5-1.0 um, for example. As shown, the gate electrodes may have a smaller width, for example, than the source electrode. Each of the gate electrodes is connected to the gate contact (not shown in the Figure).

Insulation layer 676a lines the bottom and side-wall of trench 672a and has a non-uniform thickness along the side-wall, as similarly described above. In particular, the insulation layer is thinner along the side-wall between the gate electrodes and drift region and is thicker along the lower side-wall between the drift region and the source electrode. Insulation layer 676a also extends between source electrode 673a and gate electrodes 674a and 675a, insulating the electrodes from one another.

Source contact 640 extends over the top surface of semiconductor body 602 contacting the top surface of source electrodes 673a/673b. The source contact also fills the source contact trench 614, contacting the exposed surfaces of the channel and drift regions.

As compared to devices 600A-600F, device 600G has a reduced gate-drain charge and also a lower on-resistance.

Referring now to FIG. 7A there is shown example semiconductor device 700A according to an embodiment of the invention. Device 700A has a semiconductor body 702 that includes, for example, a highly doped drain region 704, a drift region 706 of lower concentration of impurities than the drain region, and a highly doped source region 710, each of a first conductivity type (e.g., N-type), and further includes a channel region 708 of a second conductivity type opposite to that of the first conductivity type (e.g., P-type).

Semiconductor device 700A further includes a plurality of trench-based gate electrodes, such as trench-based gate electrodes 720a, 720b, and 720c. The trench-based gate electrodes include gate trenches 722a, 722b, and 722c that extend from the top surface of semiconductor body 702, through source region 710 and channel region 708, and into drift region 706, for example, and in particular, may extend to a depth of 1.3 um, for example, below the top surface of the semiconductor body. Each of the gate trenches is separated by a mesa region that may have a width of 0.35 um or less and preferably, is between 0.25 um-0.35 um.

Gate electrodes 724a, 724b, and 724c are disposed within gate trenches 722a, 722b, and 722c, respectively. The electrodes may be recessed below the top surface of semiconductor body 702 and extend above and below the top and bottom surfaces of channel region 708, for example. According to this embodiment of the invention, the gate electrodes do not extend to the bottom of the gate trenches and in particular, may extend to a depth of 0.5 um below the top surface of semiconductor body 702 and may extend to within 0.8 um, for example, from the bottom of the trenches.

A gate insulation layer 726a, 726b, and 726c lines the side-wall and bottom of the gate trenches, thereby insulating the gate electrodes from the source region, channel region, and drift region. According to this embodiment of the invention, a gate insulation plug 727a, 727b, and 727c fills the void/gap below the bottom of the gate electrodes. Covering the top of the gate electrodes and filling the remainder of the gate trenches are gate insulation caps 728a, 728b, and 728c, which insulate the gate electrodes from source contact 740. Note that according to this embodiment of the invention, the gate insulation caps vary in type between every other gate electrode. In particular, the gate insulation cap either extends to the upper surface of the semiconductor body (like gate insulation caps 728a and 728c) or extends above the top surface of semiconductor body and laterally over a portion of the top surface of source region 710 (like gate insulation cap 728b).

Semiconductor device 700A further includes drain contact 742 in electrical contact with drain region 304, and source contact 740 along the top surface of semiconductor body 702 and in electrical contact with source region 710. Source contact 740 also contacts channel region 708 along a third dimension (not shown).

Figures 7B, 7C:
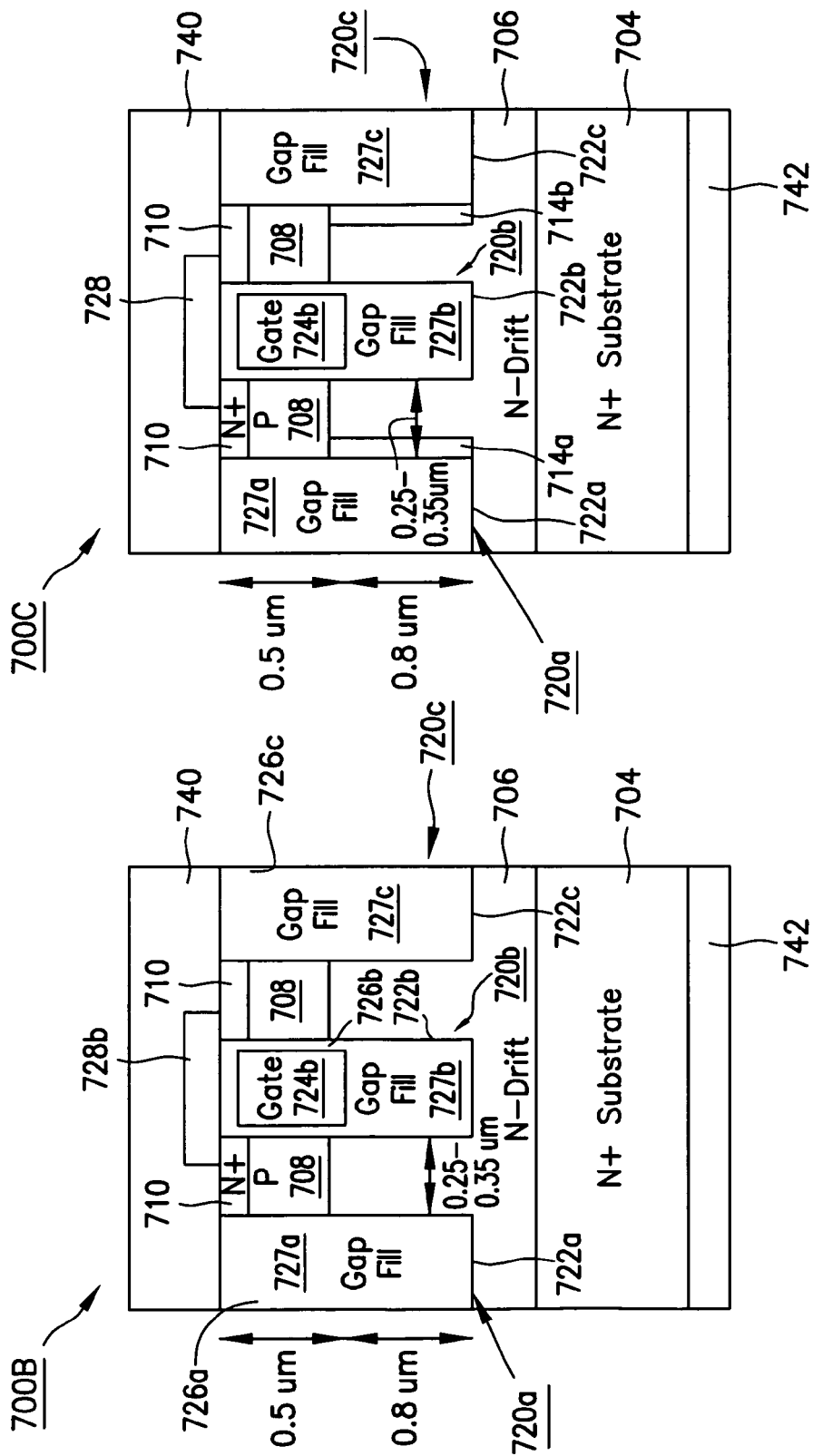
FIGS. 7B and 7C show alternate embodiments of the example device shown in FIG. 7A.

Referring now to FIG. 7B, there is shown example semiconductor device 700B according to an embodiment of the invention. Device 700B is similar to device 700A. Here, however, every other trench-based gate electrode (i.e., trench-based gate electrodes 720a and 720c) does not include a gate electrode 724a/724c. Rather, the gate insulation plug 727a/727c fills the entire trench.

Referring now to FIG. 7C, there is shown example semiconductor device 700C according to an embodiment of the invention. Device 700C is similar to device 700B. Here, however, an implant 714a and 714b of the second conductivity type (e.g., P-type) is formed within drift region 706 along the side-wall of gate trenches 722a/722b (i.e., along the side-wall of the trenches that are entirely filled with a gate insulation plug).

Note that while the embodiments of the present invention have been described using N-type trench MOSFETs as an example, one skilled in the art will recognize that the present invention is applicable to P-type trench MOSFETs.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A power semiconductor device, comprising:
   a semiconductor body of a first conductivity type;
   a plurality of gate trenches extending to a first depth within said semiconductor body;
   a plurality of source trenches extending to a second depth within said semiconductor body, said second depth being greater than said first depth;
   an insulated gate electrode within each of said plurality of gate trenches;
   an insulated source electrode within each of said plurality of source trenches;
   a channel region of a second conductivity type in said semiconductor body and having an etched surface adjacent to each of said plurality of source trenches;
   source regions formed over said channel region; and
   a source contact contacting said source regions, said source electrodes and contacting said channel region along said etched surfaces;
   wherein said plurality of gate trenches and said plurality of source trenches are arranged in a cellular design and wherein said insulated source electrodes are recessed to a depth below said source regions and contact said source contact below said source regions.

2. The device of claim 1, further comprising a drift region of said first conductivity type in said semiconductor body and beneath said channel region, wherein said drift region is doped in a monotonically increasing fashion away from said channel region.

3. The device of claim 1, wherein said insulated gate electrodes do not extend above a top surface of said semiconductor body.

4. A power semiconductor device, comprising:
   a semiconductor body having a drift region of a first conductivity type;
   a channel region over said drift region;
   source regions over said channel region;
   a plurality of gate trenches extending to a first depth within said semiconductor body;
   a plurality of source trenches extending to a second depth within said semiconductor body and extending within said drift region, said second depth being greater than said first depth;
   an insulated gate electrode within each of said plurality of gate trenches;
   an insulated source electrode within each of said plurality of source trenches and extending within said drift region, each insulated source electrode being recessed below respective source regions and having a decreasing width as it extends within said drift region; and
   a source contact over an upper surface of said semiconductor body and contacting said source electrodes below said source regions.

5. The device of claim 4, wherein side-walls of each of said plurality of source trenches slope inward substantially along said drift region, the sloping side-walls causing the decreasing width of said insulated source electrodes.

6. The device of claim 4, wherein each of said plurality of source trenches has a side-wall at least partially lined with an insulation layer, and wherein said insulation layers increase in thickness substantially along said drift region.

7. The device of claim 6, wherein said insulation layers increase in thickness in a stepwise fashion and wherein said source electrodes decrease in width in a stepwise fashion.

8. A power semiconductor device, comprising:
a semiconductor body of a first conductivity type;
a channel region of a second conductivity formed in said semiconductor body;
source regions of said first conductivity over said channel region;
a plurality of gate trenches within said semiconductor body;
a plurality of source trenches within said semiconductor body, wherein said plurality of gate trenches and said plurality of source trenches extend substantially to the same depth within said semiconductor body;
an insulated gate electrode within each of said plurality of gate trenches;
a source electrode within each of said plurality of source trenches recessed below respective source regions; and
a source metal contact in contact with said insulated source electrodes below said source regions.

9. The device of claim 8, wherein said plurality of gate trenches and said plurality of source trenches are arranged in a cellular design.

10. The device of claim 8, further comprising a drain region of the first conductivity type in said semiconductor body, and wherein said plurality of source trenches and said plurality of gate trenches extend within said drain region.

11. The device of claim 8, further comprising a drift region, a buffer region, and a drain region in said semiconductor body, each of said first conductivity type, wherein said drift region is disposed over said buffer region and said buffer region is disposed over said drain region.

12. The device of claim 11, wherein said plurality of source trenches and said plurality of gate trenches extend within said buffer region.

13. The device of claim 8, further comprising a drift region of said first conductivity type in said semiconductor body, wherein said drift region is doped in a monotonically increasing fashion from a top towards a bottom of said drift region.

14. The device of claim 8, wherein each source electrode and each gate electrode includes a free end that extends above a surface of said semiconductor body.

15. The device of claim 14, further comprising a suicide contact at said free end of each gate electrode and each source electrode.

16. The device of claim 8, further comprising:
a drift region of said first conductivity type in said semiconductor body; and
wherein said plurality of source trenches and said plurality of gate trenches extend within said drift region and include side-walls that slope inward substantially along said drift region.

17. The device of claim 16, further comprising:
a channel region of a second conductivity type in said semiconductor body and disposed above said drift region; and
wherein said side-walls of said plurality of source trenches and said plurality of gate trenches extend through said channel region at a substantially vertical angle.

18. The device of claim 8, further comprising a plurality of Schottky contacts on said semiconductor body, each Schottky contact being between adjacent source and gate trenches.

19. The device of claim 8, further comprising a plurality of P-N diodes, each P-N diode being formed between adjacent source trenches.

20. The device of claim 8, wherein each gate electrode extends to a first depth within its respective gate trench and each source electrode extends to a second depth within its respective source trench, said second depth being greater than said first depth.

21. The device of claim 20, further comprising a gate insulation plug within each of said plurality of gate trenches, each insulation plug being disposed below the respective gate electrode.

22. The device of claim 20, further comprising a floating gate electrode within each of said plurality of gate trenches.

23. The device of claim 20, further comprising a second gate electrode within each of said plurality of gate trenches, said second gate electrode and said insulated gate electrode within each gate trench being electrically connected through a gate contact.

24. The device of claim 20, further comprising:
a drift region of said first conductivity type in said semiconductor body, wherein said plurality of source trenches and said plurality of gate trenches extend within said drift region; and
an insulation layer lining at least a portion of a side-wall of each of said plurality of source trenches, wherein each insulation layer has an increasing thickness substantially along said drift region.

25. The device of claim 24, wherein each source electrode extends within said drift region and has a decreasing width as it extends within said drift region.

26. The device of claim 24, wherein said insulation layers increase in thickness in a stepwise fashion.

27. The device of claim 26, wherein each source electrode extends within said drift region and decreases in width in a stepwise fashion as it extends within said drift region.

28. The device of claim 20, further comprising at least a second source electrode within each of said plurality of source trenches, each of said at least second source electrodes being in contact with said source contact.

29. The device of claim 28, wherein each of said at least second source electrodes extends substantially to said first depth within its respective source trench.

30. The device of claim 20, further comprising:
a source insulation layer lining at least a portion of a side-wall of each of said plurality of source trenches; and
a gate insulation layer lining at least a portion of a side-wall of each of said plurality of gate trenches; and
wherein a side-wall thickness of said source insulation layer is thicker than a side-wall thickness of said gate insulation layer.

31. The device of claim 8, further comprising:
a drift region of said first conductivity type in said semiconductor body;
a channel region of a second conductivity type in said semiconductor body and disposed over said drift region, wherein said plurality of source trenches and said plurality of gate trenches extend within said channel region and said drift region;
a first implant region of said second conductivity type formed within said drift region at a bottom of each of said plurality of source trenches;
a second implant region of said first conductivity type formed within said drift region at a bottom of each of said plurality of gate trenches; and wherein said source contact metal fills each of said plurality of source trenches, thereby forming said source electrodes.

32. The device of claim 8, further comprising:

a drift region of said first conductivity type in said semiconductor body;

a channel region of a second conductivity type in said semiconductor body and disposed above said drift region;

wherein each gate electrode and each source electrode extends within its respective trench along said channel region and along said drift region; and wherein each gate electrode and each source electrode has a first width substantially along said channel region and a second width substantially along said drift region, said first width being greater than said second width.

33. The device of claim 8, further comprising:

a drift region of said first conductivity type in said semiconductor body;

a channel region of a second conductivity type in said semiconductor body and disposed above said drift region;

wherein each gate electrode and each source electrode extends within its respective trench along said channel region and along said drift region;

wherein each gate electrode has a first width substantially along said channel region and a second width substantially along said drift region, said first width being greater than said second width; and wherein each source electrode has a substantially uniform width less than said first width.

34. The device of claim 8, further comprising:

a plurality of varying length insulated gate electrodes within each of said plurality of gate trenches; and a plurality of varying length insulated source electrodes within each of said plurality of source trenches, each of said plurality of source electrodes being in contact with said source contact.

* * * * *